US012689184B2

(12) United States Patent
Fujita et al.

(10) Patent No.: US 12,689,184 B2
(45) Date of Patent: Jul. 21, 2026

(54) LASER MODULE

(71) Applicant: HAMAMATSU PHOTONICS K.K., Hamamatsu (JP)

(72) Inventors: Kazuue Fujita, Hamamatsu (JP); Shohei Hayashi, Hamamatsu (JP); Hiroyasu Fujiwara, Hamamatsu (JP); Atsushi Nakanishi, Hamamatsu (JP); Akio Ito, Hamamatsu (JP); Tatsuo Dougakiuchi, Hamamatsu (JP)

(73) Assignee: HAMAMATSU PHOTONICS K.K., Hamamatsu-shi (JP)

( * ) Notice: Subject to any disclaimer, the term of this patent is extended or adjusted under 35 U.S.C. 154(b) by 757 days.

(21) Appl. No.: 17/608,225

(22) PCT Filed: Dec. 16, 2020

(86) PCT No.: PCT/JP2020/047029
§ 371 (c)(1),
(2) Date: Nov. 2, 2021

(87) PCT Pub. No.: WO2021/125240
PCT Pub. Date: Jun. 24, 2021

(65) Prior Publication Data
US 2022/0209505 A1    Jun. 30, 2022

(30) Foreign Application Priority Data
Dec. 20, 2019    (JP) ................................ 2019-230781

(51) Int. Cl.
*H01S 5/34*        (2006.01)
*H01S 5/343*       (2006.01)

(52) U.S. Cl.
CPC ........ *H01S 5/3401* (2013.01); *H01S 5/34346* (2013.01)

(58) Field of Classification Search
CPC ............................. H01S 5/3401; H01S 5/3402
See application file for complete search history.

(56) References Cited

U.S. PATENT DOCUMENTS 8,619,832 B2    12/2013  Hu et al.
9,742,151 B1 *   8/2017  Botez ................... H01S 5/0287
(Continued)

FOREIGN PATENT DOCUMENTS

JP          2017-050307 A      3/2017

OTHER PUBLICATIONS

Hensley et al. "Demonstration of an External Cavity Terahertz Quantum Cascade Laser," in Optical Terahertz Science and Technology, Technical Digest (CD) (Optica Publishing Group, 2005) (Year: 2005).*

(Continued)

*Primary Examiner* — Minsun O Harvey
*Assistant Examiner* — Stephen Sutton Kotter
(74) *Attorney, Agent, or Firm* — FAEGRE DRINKER BIDDLE & REATH LLP

(57)                ABSTRACT

A laser module including a quantum cascade laser that includes a substrate having a main surface, a first clad layer provided on the main surface, an active layer provided on the first clad layer, and a second clad layer provided on the active layer, and a lens that has a lens plane disposed at a position facing the end surface of the active layer. An end surface of the active layer constitutes a resonator that causes light of a first frequency and light of a second frequency to oscillate, and the active layer is configured to generate a terahertz wave of a differential frequency between the first frequency and the second frequency. The substrate is in direct contact or indirect contact with the lens plane, and the end surface of the active layer is inclined with respect to a portion facing the end surface in the lens plane.

6 Claims, 19 Drawing Sheets

(56)        References Cited

U.S. PATENT DOCUMENTS

| | | | |
|---|---|---|---|
| 2010/0002739 A1* | 1/2010 | Hu ........................... | H01S 1/02 |
| | | | 372/45.01 |
| 2010/0135337 A1 | 6/2010 | Belkin et al. | |
| 2016/0308331 A1* | 10/2016 | Belkin ................. | H01S 5/0208 |
| 2017/0063038 A1* | 3/2017 | Ito ........................... | H01S 5/142 |

OTHER PUBLICATIONS

Karun Vijayraghavan et al., "Terahertz Quantum Cascade Laser Sources Based on Cherenkov Intra-Cavity Difference-Frequency Generation", Lasers and Electro-Optics (CLEO), 2012 Conference on, IEEE, May 6, 2012, p. 1-p. 2, XP032246324.

Karun Vijayraghavan et al., "Terahertz sources based on Cerenkov difference-frequency generation in quantum cascade lasers", Applied Physics Letters, American Institute of Physics, 2 Huntington Quadrangle, Melville, NY 11747, vol. 100, No. 25, Jun. 18, 2012, p. 251104, XP012156611.

Belkin Mikhail A. et al, "Room temperature terahertz quantum cascade laser source based on intracavity difference-frequency generation", Applied Physics Letters, vol. 92, No. 20, May 19, 2008, XP093102737.

Lee Alan et al, "High-power and high-temperature THz quantumcascade lasers based on lens-coupled metal-metal waveguides", Optics letters, Oct. 1, 2007, p. 2840-p. 2842, XP093102209.

Fujita Kazuue et al, "Sub-terahertz and terahertz generation in long-wavelength quantum cascade lasers", NANOPHOTONICS, vol. 8, No. 12, Nov. 2, 2019, p. 2235-p. 2241, XP093102365.

English-language translation of International Preliminary Report on Patentability (IPRP) dated Jun. 30, 2022 that issued in WO Patent Application No. PCT/JP2020/047029.

* cited by examiner

*Fig.7*

| SEMICONDUCTOR LAYER | | COMPOSI-TION | LAYER THICKNESS | DOPING |
|---|---|---|---|---|
| INJECTION BARRIER LAYER171 | | InAlAs | 3.8nm | undoped |
| LIGHT-EMITTING LAYER 17 | WELL LAYER161 | InGaAs | 3.8nm | undoped |
| | BARRIER LAYER172 | InAlAs | 2.3nm | undoped |
| | 162 | InGaAs | 8.5nm | undoped |
| | 173 | InAlAs | 1.0nm | undoped |
| | 163 | InGaAs | 6.9nm | undoped |
| | 174 | InAlAs | 1.1nm | undoped |
| | 164 | InGaAs | 5.6nm | undoped |
| EXTRACTION BARRIER LAYER191 | | InAlAs | 1.2nm | undoped |
| INJECTION LAYER 18 | WELL LAYER181 | InGaAs | 4.8nm | undoped |
| | BARRIER LAYER192 | InAlAs | 1.3nm | undoped |
| | 182 | InGaAs | 4.5nm | undoped |
| | 193 | InAlAs | 1.4nm | undoped |
| | 183 | InGaAs | 4.2nm | undoped |
| | 194 | InAlAs | 1.6nm | Si doped: $9 \times 10^{16}/cm^3$ |
| | 184 | InGaAs | 4.1nm | Si doped: $9 \times 10^{16}/cm^3$ |
| | 195 | InAlAs | 1.8nm | Si doped: $9 \times 10^{16}/cm^3$ |
| | 185 | InGaAs | 4.0nm | Si doped: $9 \times 10^{16}/cm^3$ |
| | 196 | InAlAs | 2.3nm | undoped |
| | 186 | InGaAs | 4.0nm | undoped |
| | 197 | InAlAs | 2.6nm | undoped |
| | 187 | InGaAs | 4.0nm | undoped |

*Fig.17*
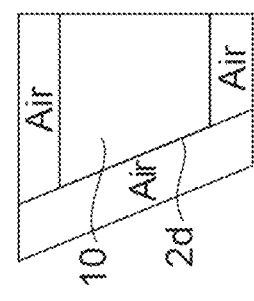
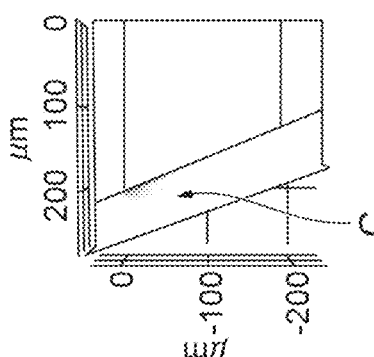
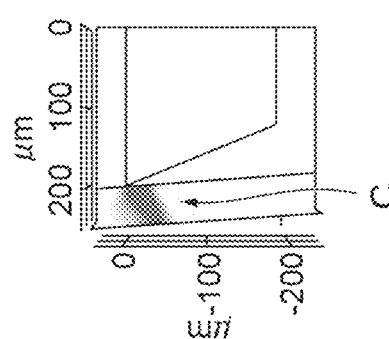
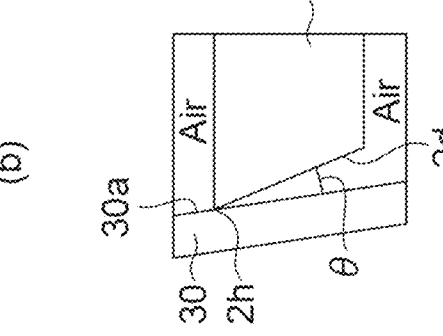
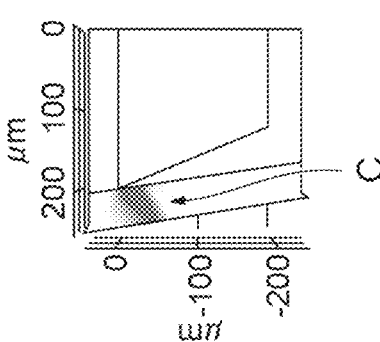
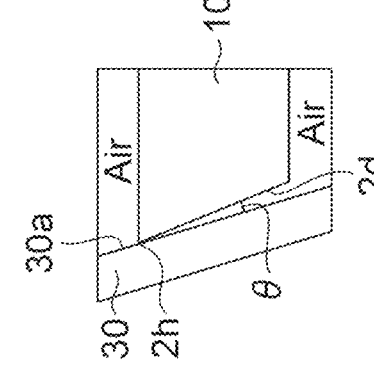
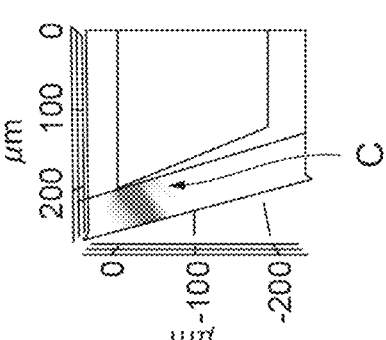

*Fig.18*
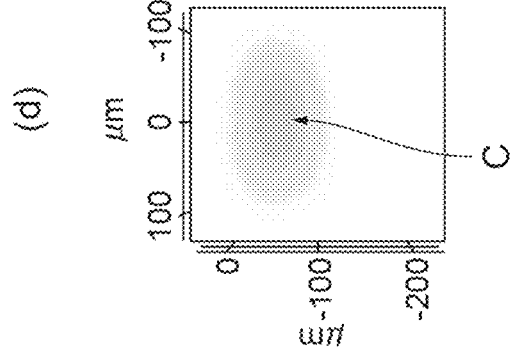
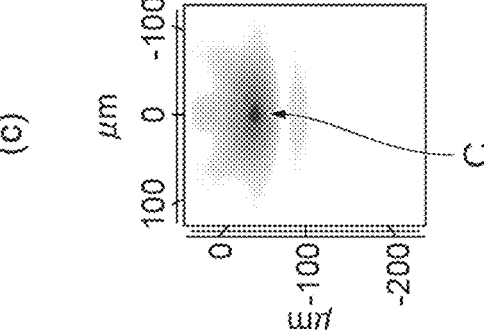
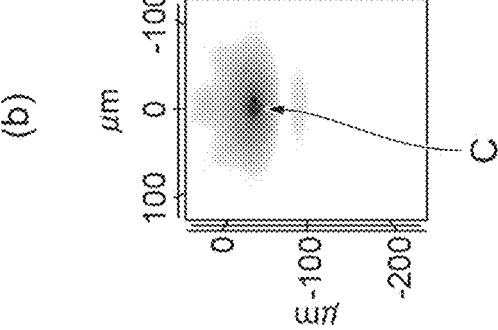
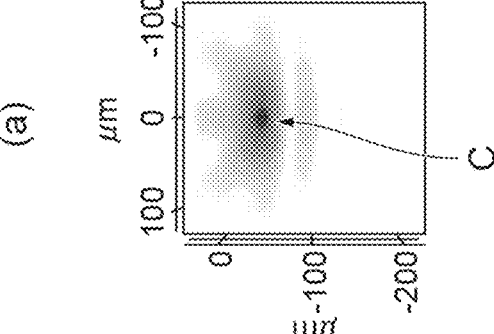

LASER MODULE

TECHNICAL FIELD

The present disclosure relates to a laser module.

BACKGROUND ART

In the related art, a laser module including a quantum cascade laser including an active layer that generates a terahertz wave by light oscillation, and an optical element including a lens is known (for example, refer to Patent Literature 1). In the laser module, the terahertz wave generated in the active layer is condensed by the lens and then is output to the outside of the laser module.

CITATION LIST

Patent Literature

Patent Literature 1: U.S. Pat. No. 8,619,832

SUMMARY OF INVENTION

Technical Problem

In the laser module described in Patent Literature 1, the entirety of an end surface of the quantum cascade laser is brought into contact with an optical element (a lens or a spacer). According to the finding of the present inventors, in the case of employing the configuration, there is a concern that light oscillation in the active layer may be unstable. On the other hand, in a case where the end surface of the quantum cascade laser is spaced apart from the optical element, there is a concern that the terahertz wave is totally reflected in an air layer between the quantum cascade laser and the optical element, and thus extraction efficiency of the terahertz wave may deteriorate.

Therefore, an object of an aspect of the present disclosure is to provide a laser module capable of stabilizing light oscillation in an active layer and improving extraction efficiency of a terahertz wave generated in the active layer.

Solution to Problem

According to an aspect of the present disclosure, there is provided a laser module including a quantum cascade laser that includes a substrate having a main surface and a rear surface opposite to the main surface, a first clad layer provided on the main surface, an active layer provided on a side of the first clad layer which is opposite to the substrate, and a second clad layer provided on a side of the active layer which is opposite to the first clad layer, and a lens that has a lens plane disposed at a position facing an end surface of the active layer. The end surface of the active layer in a direction intersecting a stacking direction of the substrate, the first clad layer, the active layer, and the second clad layer constitutes a resonator that causes light of a first frequency and light of a second frequency to oscillate, and the active layer is configured to generate a terahertz wave of a differential frequency between the first frequency and the second frequency. The substrate is in direct contact or indirect contact with the lens plane, and the end surface of the active layer is inclined with respect to a portion facing the end surface in the lens plane.

In the laser module, the substrate is in direct contact or indirect contact with the lens plane. According to this, it is possible to cause the terahertz wave to propagate to the lens plane through the substrate, and thus extraction efficiency of the terahertz wave can be improved. Further, the end surface of the active layer is inclined with respect to a portion facing the end surface in the lens plane. That is, the entirety of the end surface of the active layer is not in contact with the lens plane. According to this, at the end surface of the active layer which constitutes the resonator, it is possible to cause light for generating the terahertz wave to stably oscillate. As described above, according to the laser module, light oscillation in the active layer is stabilized, and the extraction efficiency of the terahertz wave generated in the active layer can be improved.

A focal point of the lens may be located inside the quantum cascade laser. According to this configuration, it is possible to cause the terahertz wave to more efficiently propagate to the lens side.

The substrate may be in line contact with the lens plane. According to this configuration, even in a case where a contact area of the substrate with respect to the lens plane is small, it is possible to cause the terahertz wave to efficiently propagate to the lens side.

The substrate may have a first surface extending from the rear surface to the main surface side to be inclined with respect to the lens plane, and a corner portion formed at an end portion of the first surface on the main surface side may be in line contact with the lens plane. According to this configuration, the corner portion formed at the end portion of the first surface on the main surface side is brought into contact with the lens plane, thereby realizing a configuration of bringing the substrate and the lens plane into line contact with each other.

The substrate may have a side surface that connects the main surface and the rear surface to each other, and faces the lens plane, and a corner portion formed between the rear surface and the side surface may be in line contact with the lens plane. According to this configuration, the corner portion between the rear surface and the side surface is brought into contact with the lens plane, thereby realizing a configuration of bringing the substrate and the lens plane into line contact with each other.

The thickness of the substrate from the main surface to the rear surface may be 200 μm or less. According to this configuration, attenuation of the terahertz wave, which is generated in the active layer, inside the substrate is suppressed, and extraction efficiency of the terahertz wave can be further improved.

The substrate may be in surface contact with the lens plane. According to this configuration, since a contact area of the substrate with respect to the lens plane increases, breakage of the substrate at a contact portion between the lens plane and the substrate is suppressed.

The substrate may have a first surface that extends from the rear surface to the main surface side to be inclined with respect to the lens plane, and a second surface that is connected to an end portion of the first surface on the main surface side and is parallel to the lens plane, and the second surface may be in surface contact with the lens plane. According to this configuration, the second surface parallel to the lens plane is brought into contact with the lens plane, thereby realizing a configuration of bringing the substrate and the lens plane into surface contact with each other. In addition, since the first surface is provided, a contact area between the substrate and the lens plane can be suppressed to be small.

The laser module may further include a spacer that is disposed between the quantum cascade laser and the lens.

The spacer may have an output surface that is parallel to the lens plane and is in contact with the lens plane, and an input surface opposite to the output surface, the substrate may be in contact with the input surface of the spacer, and the end surface of the active layer may be inclined with respect to the input surface of the spacer. For example, when moving the lens with respect to the quantum cascade laser in a state where the substrate is in contact with the lens plane for lens alignment with respect to the quantum cascade laser, there is a concern that the quantum cascade laser may be broken due to friction between the quantum cascade laser and the lens plane. According to this configuration, lens alignment with respect to the quantum cascade laser can be performed by moving the lens with respect to the spacer in a state where a positional relationship between the quantum cascade laser and the spacer is fixed (that is, a state where friction does not occur between the quantum cascade laser and the spacer). Accordingly, breakage of the quantum cascade laser is suppressed.

A refractive index of the spacer may be approximately the same as a refractive index of the lens. According to this configuration, reflection loss of the terahertz wave at an interface between the spacer and the lens can be suppressed.

The laser module may further include a mounting portion that includes a mounting surface on which the rear surface of the substrate is mounted, and a contact surface that is connected to the mounting surface and is in contact with the input surface of the spacer. An angle made by the mounting surface and the contact surface may be an acute angle. According to this configuration, positioning of the quantum cascade laser and the spacer can be easily performed through the mounting portion.

Advantageous Effects of Invention

According to an aspect of the present disclosure, it is possible to provide a laser module capable of stabilizing light oscillation in an active layer and improving extraction efficiency of a terahertz wave generated in the active layer.

BRIEF DESCRIPTION OF DRAWINGS

FIG. 7 is a table showing a specific example of the configuration of the active layer.

FIG. 17 is a view illustrating an effect verification result of the laser module.

FIG. 18 is a view illustrating an effect verification result of the laser module.

DESCRIPTION OF EMBODIMENTS

Figure 1:
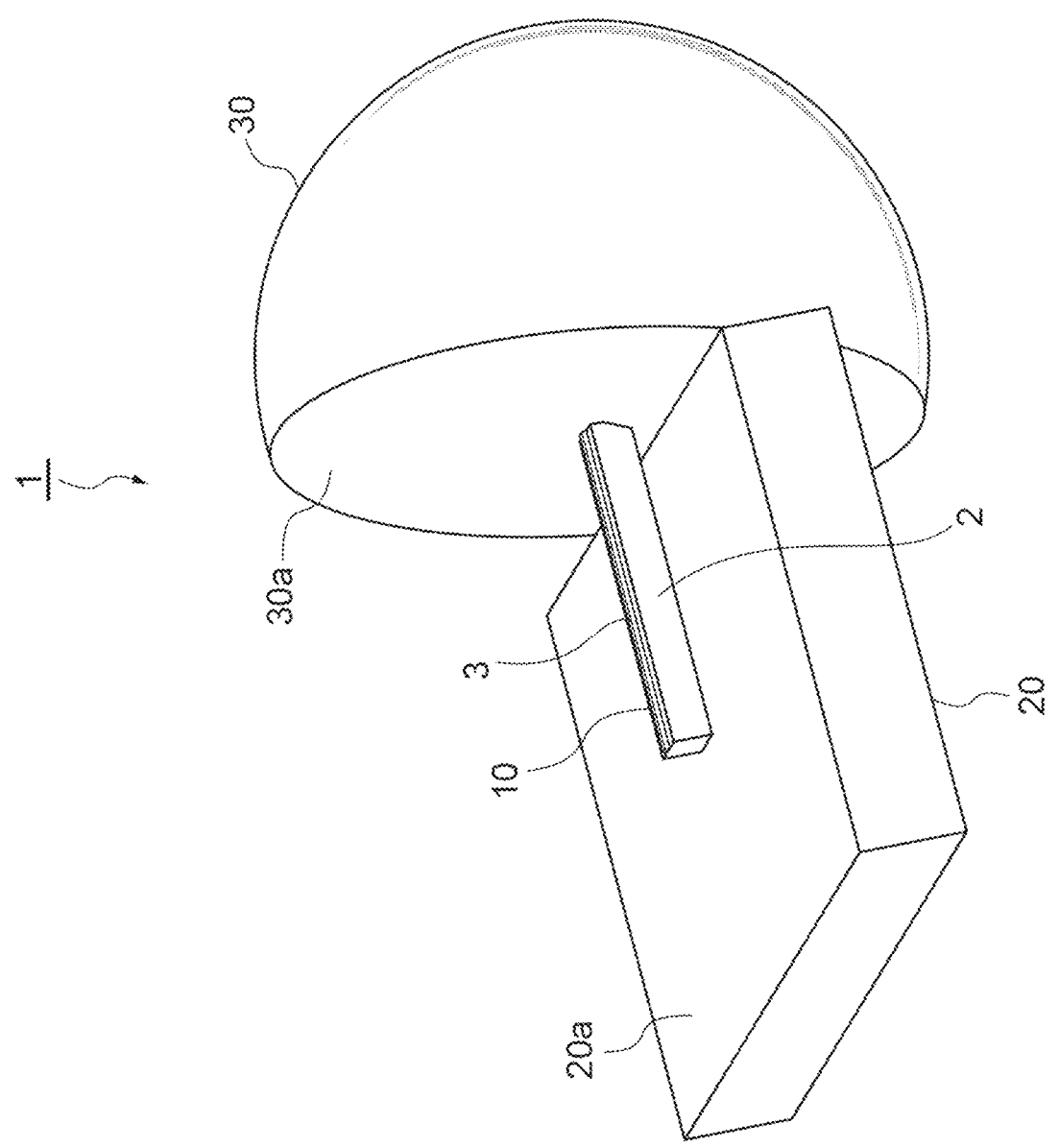
FIG. 1 is a perspective view of a laser module according to an embodiment.

Hereinafter, an embodiment of the present disclosure will be described in detail with reference to the accompanying drawings. Note that, in the drawings, the same reference numeral will be given to the same or equivalent portion, and redundant description will be omitted. In addition, dimensions or dimension ratios of respective members (or portions) illustrated in the drawings may be different from actual dimensions or dimension ratios for easy understanding of explanation.

Figure 2:
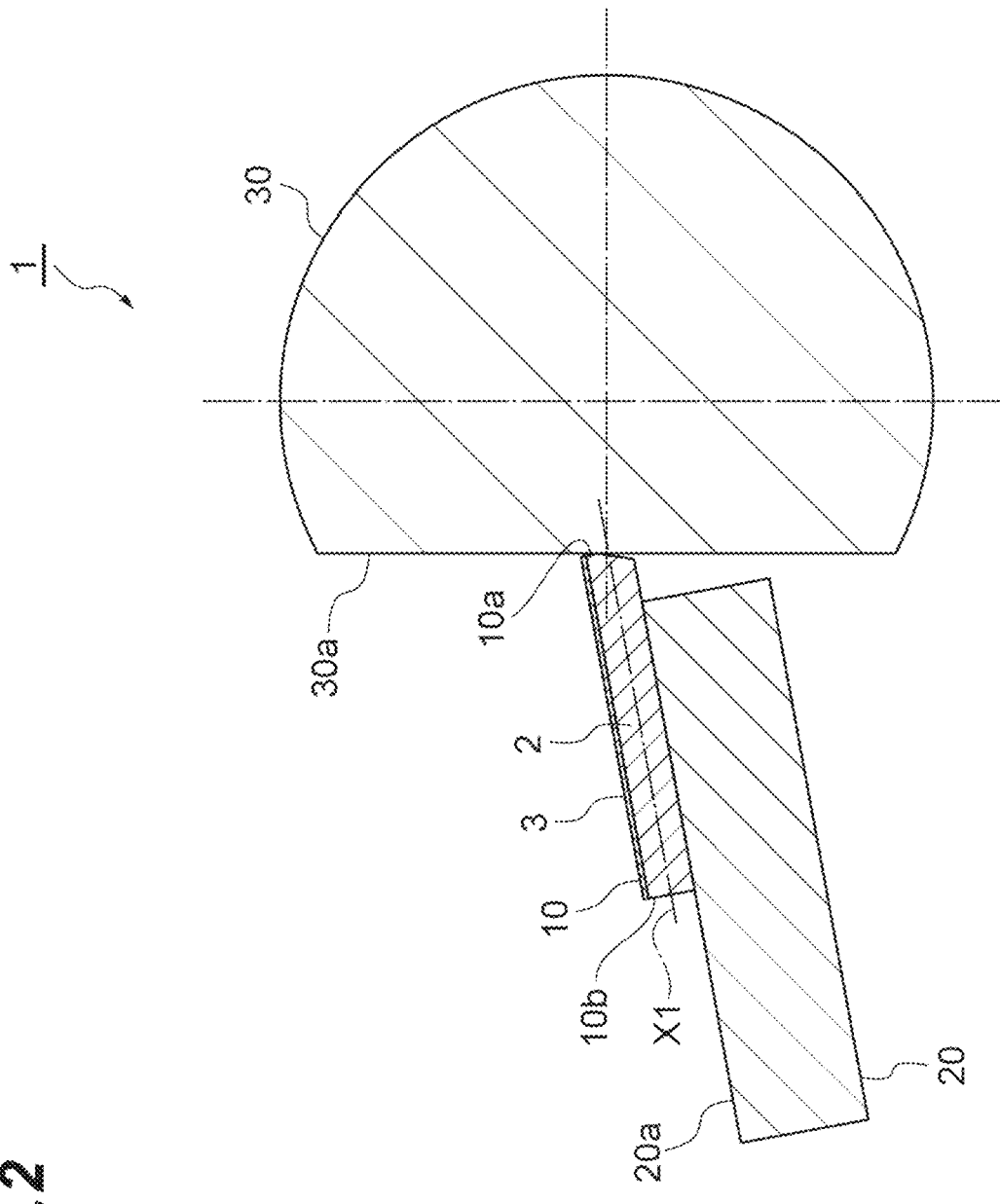
FIG. 2 is a cross-sectional view of the laser module.

As illustrated in FIG. 1 and FIG. 2, a laser module (for example, an external resonator type) 1 includes a quantum cascade laser (hereinafter, referred to as "QCL") 10, a submount (mounting portion) 20, and a lens 30.

The QCL 10 is a light source capable of outputting a terahertz wave under a room temperature environment. The QCL 10 has a rod shape. The QCL 10 extends along an axial line X1. The QCL 10 has a first end surface 10a and a second end surface 10b which are opposite to each other along the axial line X1, and emits light of a wide band (for example, 3 to 20 μm) in a mid-infrared region from the first end surface 10a and the second end surface 10b, respectively. The QCL 10 has a structure in which a plurality of active layers different in a center wavelength are stacked in a stack shape, and can emit light of a wide band as described above. Note that, the QCL 10 may have a structure including a single active layer, and even in this case, the QCL 10 can emit light of a wide band.

The QCL 10 is mounted on a mounting surface 20a of the submount 20. The QCL 10 is fixed onto the submount 20. For example, the submount 20 is a ceramic substrate containing aluminum nitride (AlN). For example, the lens 30 is a super hemispherical lens formed from silicon (Si). The lens 30 has a flat lens plane 30a. The lens 30 is disposed on the first end surface 10a side with respect to the QCL 10 so that the lens plane 30a faces the QCL 10. A terahertz wave emitted from the QCL 10 is incident to the lens plane 30a. The lens 30 condenses the terahertz wave emitted from the QCL 10. The QCL 10 and the submount 20 are inclined with respect to the lens plane 30a. Specifically, the axial line X1 of the QCL 10 and the mounting surface 20a of the submount 20 are inclined with respect to the lens plane 30a.

[Configuration of Quantum Cascade Laser]

Figure 3:
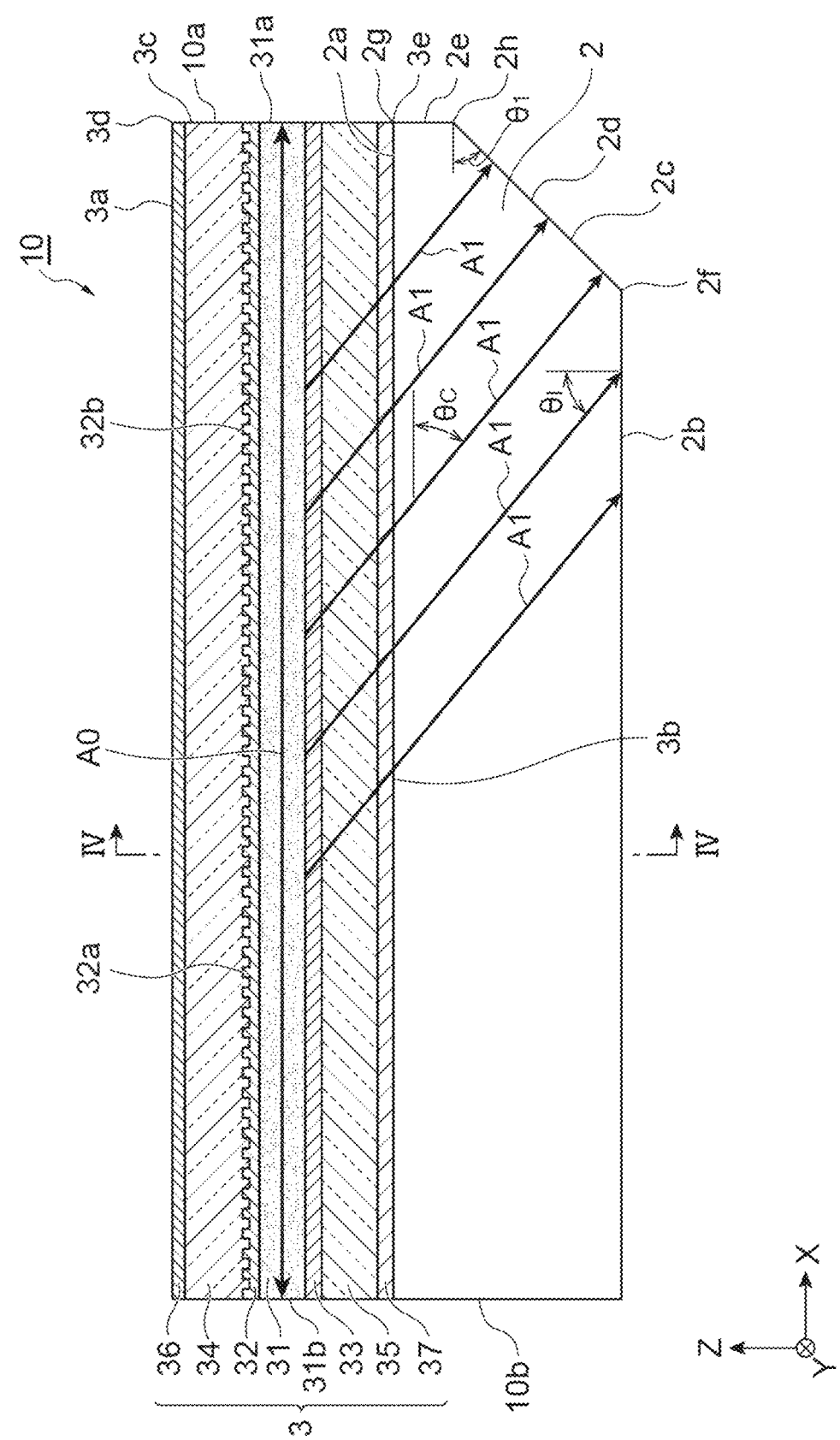
FIG. 3 is a cross-sectional view of a quantum cascade laser of the laser module.
Figure 4:
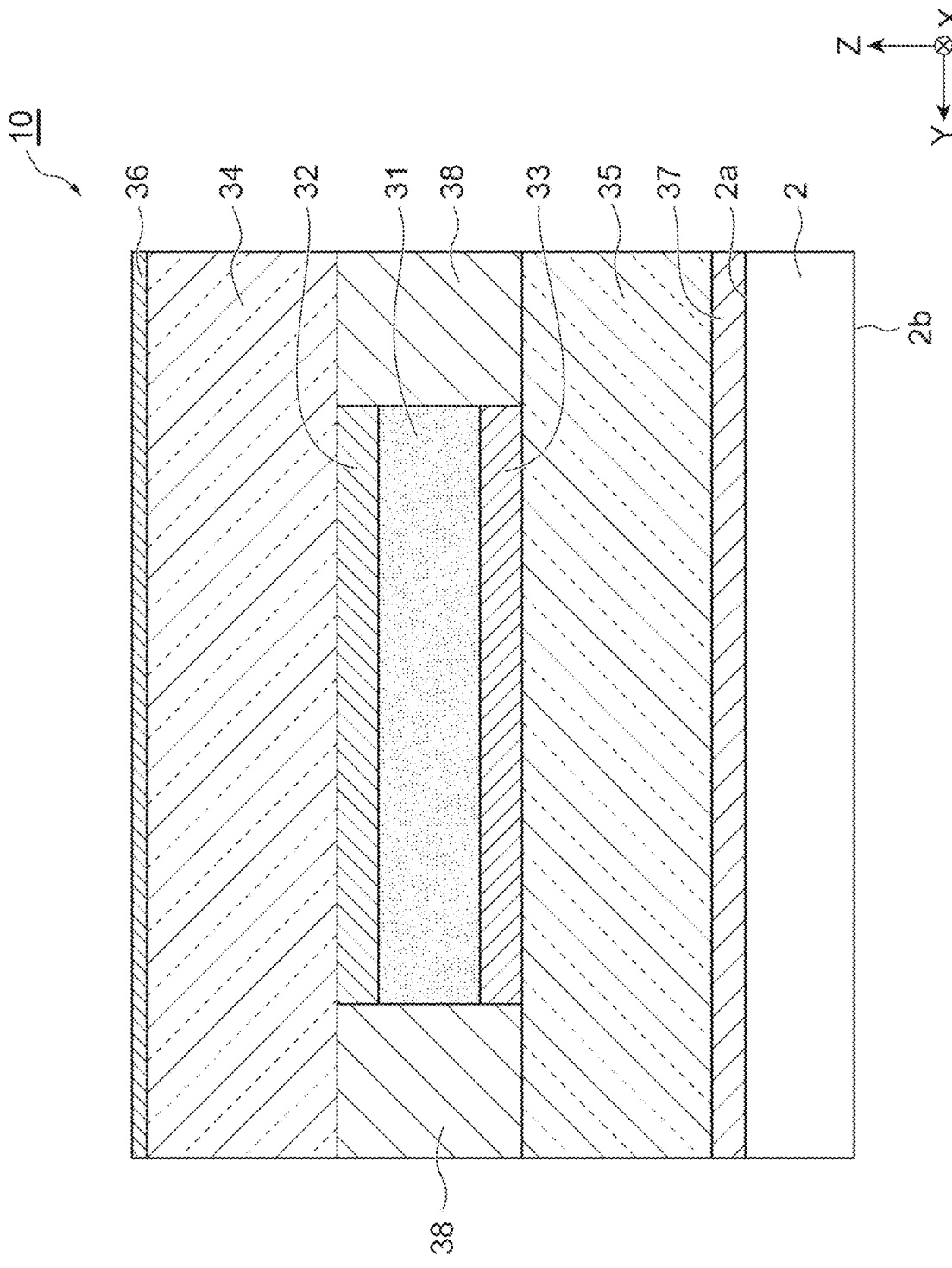
FIG. 4 is a cross-sectional view taken along line IV-IV in FIG. 3.

As illustrated in FIG. 3 and FIG. 4, the QCL 10 includes a semiconductor substrate 2 and a semiconductor layer 3. The semiconductor substrate 2 has a main surface 2a and a rear surface 2b opposite to the main surface 2a. The main surface 2a and the rear surface 2b are flat surfaces along the axial line X1 of the QCL 10. The rear surface 2b of the semiconductor substrate 2 is mounted on the mounting surface 20a of the submount 20. For example, the semiconductor substrate 2 is an InP single crystal substrate (semi-insulating substrate: high-resistance semiconductor substrate not doped with impurities) having a rectangular plate shape. A length, a width, and the thickness of the semiconductor substrate 2 are approximately several hundred μm to several mm, several hundred μm to several mm, and several hundred μm, respectively. In the following description, a longitudinal direction, a width direction, and a thickness direction (direction in which the main surface 2a and the rear surface 2b are opposite to each other) of the semiconductor substrate 2 are referred to as an X-axis direction, a Y-axis direction, and a Z-axis direction, respectively.

The semiconductor substrate 2 has a side surface 2c that connects the main surface 2a and the rear surface 2b. The side surface 2c is a part of the first end surface 10a of the QCL 10. The side surface 2c faces the lens plane 30a. The side surface 2c includes a first surface 2d and a second surface 2e.

The first surface 2d is a flat surface. The first surface 2d is connected to the rear surface 2b, and extends from the rear surface 2b to the main surface 2a side. The first surface 2d is inclined with respect to the main surface 2a and the rear surface 2b. The first surface 2d is inclined to be further spaced apart from the second end surface 10b as going toward the main surface 2a side from the rear surface 2b. An angle $\theta_1$ made by the first surface 2d and the main surface 2a is, for example, approximately 30° to 80°. For example, the first surface 2d is formed by polishing a rectangular plate-shaped semiconductor substrate. That is, the first surface 2d is a polished surface. A first corner portion 2f is formed between the first surface 2d and the rear surface 2b. The first corner portion 2f is a portion at which the first surface 2d and the rear surface 2b are connected to each other. The first corner portion 2f extends along the Y-axis direction.

The second surface 2e is a flat surface. The second surface 2e is connected to an end portion of the first surface 2d on the main surface 2a side, and the main surface 2a. The second surface 2e is inclined with respect to the first surface 2d. The second surface 2e is approximately orthogonal to the main surface 2a and the rear surface 2b. A second corner portion 2g is formed between the second surface 2e and the main surface 2a. The second corner portion 2g is a portion at which the second surface 2e and the main surface 2a are connected to each other. The second corner portion 2g extends along the Y-axis direction.

A third corner portion 2h is formed between the first surface 2d and the second surface 2e. The third corner portion 2h is a portion at which the first surface 2d and the second surface 2e are connected to each other. The third corner portion 2h is formed at an end portion of the first surface 2d on the main surface 2a side, and an end portion of the second surface 2e on the rear surface 2b side. Since the first surface 2d is an inclined surface as described above, the first corner portion 2f is located on a further second end surface 10b side of the QCL 10 in comparison to the third corner portion 2h. The third corner portion 2h extends along the Y-axis direction.

The semiconductor layer 3 is provided on the main surface 2a of the semiconductor substrate 2. The semiconductor layer 3 has a side surface 3c. The side surface 3c is a part of the first end surface 10a of the QCL 10. The side surface 3c is a flat surface. The side surface 3c is approximately orthogonal to the main surface 2a and the rear surface 2b of the semiconductor substrate 2. That is, in this embodiment, the side surface 3c is flush with the second surface 2e of the semiconductor substrate 2. The side surface 3c includes a first edge 3d and a second edge 3e. The first edge 3d is an edge of the side surface 3c on a side opposite to the semiconductor substrate 2. The first edge 3d extends along the Y-axis direction. The second edge 3e is an edge of the side surface 3c on the semiconductor substrate 2 side. The second edge 3e extends along the Y-axis direction. The second edge 3e overlaps the second corner portion 2g of the semiconductor substrate 2. The thickness of the semiconductor layer 3 is approximately 10 to 20 μm.

The semiconductor layer 3 includes an active layer 31, an upper guide layer 32, a lower guide layer 33, an upper clad layer (second clad layer) 34, a lower clad layer (first clad layer) 35, an upper contact layer 36, a lower contact layer 37, and a support layer 38. For example, the lower contact layer 37 is an InGaAs layer (Si doped: $1.5\times10^{18}/\text{cm}^3$) having a thickness of approximately 400 nm, and is provided on the main surface 2a of the semiconductor substrate 2. For example, the lower clad layer 35 is an InP layer (Si doped: $1.5\times10^{16}/\text{cm}^3$) having a thickness of approximately 5 μm, and is provided on a surface of the lower contact layer 37. That is, the lower clad layer 35 is provided on the main surface 2a of the semiconductor substrate 2 through the lower contact layer 37. For example, the lower guide layer 33 is an InGaAs layer (Si doped: $1.5\times10^{16}/\text{cm}^3$) having a thickness of approximately 250 nm, and is provided on a surface of the lower clad layer 35. The active layer 31 is a layer having a quantum cascade structure (details thereof will be described later), and is provided on a surface of the lower guide layer 33. That is, the active layer 31 is provided on a side of the lower clad layer 35 which is opposite to the semiconductor substrate 2.

For example, the upper guide layer 32 is an InGaAs layer (Si doped: $1.5\times10^{16}/\text{cm}^3$) having a thickness of approximately 450 nm, and is provided on a surface of the active layer 31. For example, the upper clad layer 34 is an InP layer (Si doped: $1.5\times10^{16}/\text{cm}^3$) having a thickness of approximately 5 μm, and is provided on a surface of the upper guide layer 32. That is, the upper clad layer 34 is provided on a side of the active layer 31 which is opposite to the lower clad layer 35. For example, the upper contact layer 36 is an InP layer (Si doped: $1.5\times10^{18}/\text{cm}^3$) having a thickness of approximately 15 nm, and is provided on a surface of the upper clad layer 34. For example, the support layer 38 is an InP layer (Fe doped) and is provided between the lower clad layer 35 and the upper clad layer 34 on both sides of the active layer 31, the upper guide layer 32, and the lower guide layer 33 which are formed in a ridge strip shape. End surfaces of the active layer 31, the upper guide layer 32, the lower guide layer 33, the upper clad layer 34, the lower clad layer 35, the upper contact layer 36, the lower contact layer 37, and the support layer 38 on the lens 30 side are flush with each other, and constitute the side surface 3c of the semiconductor layer 3. Note that, an electrode may be provided on a surface of the upper contact layer 36.

A diffraction lattice structure functioning as a distributed feedback (DFB) structure along a resonance direction A0 of first pump light and second pump light (details thereof will be described later) is formed in the upper guide layer 32. The upper guide layer 32 includes diffraction lattice layers 32a and 32b arranged in parallel in the resonance direction A0 as the diffraction lattice structure. The diffraction lattice layer 32a causes the first pump light to oscillate in a single mode. The diffraction lattice layer 32b causes the second pump light to oscillate in a single mode. Note that, in this embodiment, the resonance direction A0 is a direction parallel to the X-axis direction.

[Configuration of Active Layer]

The configuration of the above-described active layer 31 will be described in more detail. The active layer 31 is configured to generate first pump light of a first frequency $\omega_1$ and second pump light of a second frequency $\omega_2$ by light emission transition of electrons between subbands and to generate a terahertz wave of a differential frequency $\omega$ ($=|\omega_1-\omega_2|$) between the first frequency $\omega_1$ and the second frequency $\omega_2$ by differential frequency generation by Cherenkov phase matching. Specifically, the active layer 31 has a dual-upper-state to multiple lower state (DAUNTS) structure.

The active layer 31 has an end surface 31a and an end surface 31b opposite to the end surface 31a. Each of the end surface 31a and the end surface 31b faces the X-axis direction (direction intersecting a stacking direction (Z-axis direction) of the semiconductor substrate 2, the lower clad layer 35, the active layer 31, and the upper clad layer 34). The end surface 31a is a part of the first end surface 10a of the QCL 10. The end surface 31a is a part of the side surface 3c of the semiconductor layer 3. That is, the end surface 31a is approximately orthogonal to the main surface 2a of the semiconductor substrate 2. The end surface 31a faces the lens plane 30a of the lens 30. That is, the lens plane 30a is disposed at a position facing the end surface 31a of the active layer 31. The end surface 31b is a part of the second end surface 10b of the QCL 10. The end surface 31a and the end surface 31b constitute a resonator that causes the first pump light and the second pump light to oscillate.

Figure 5:
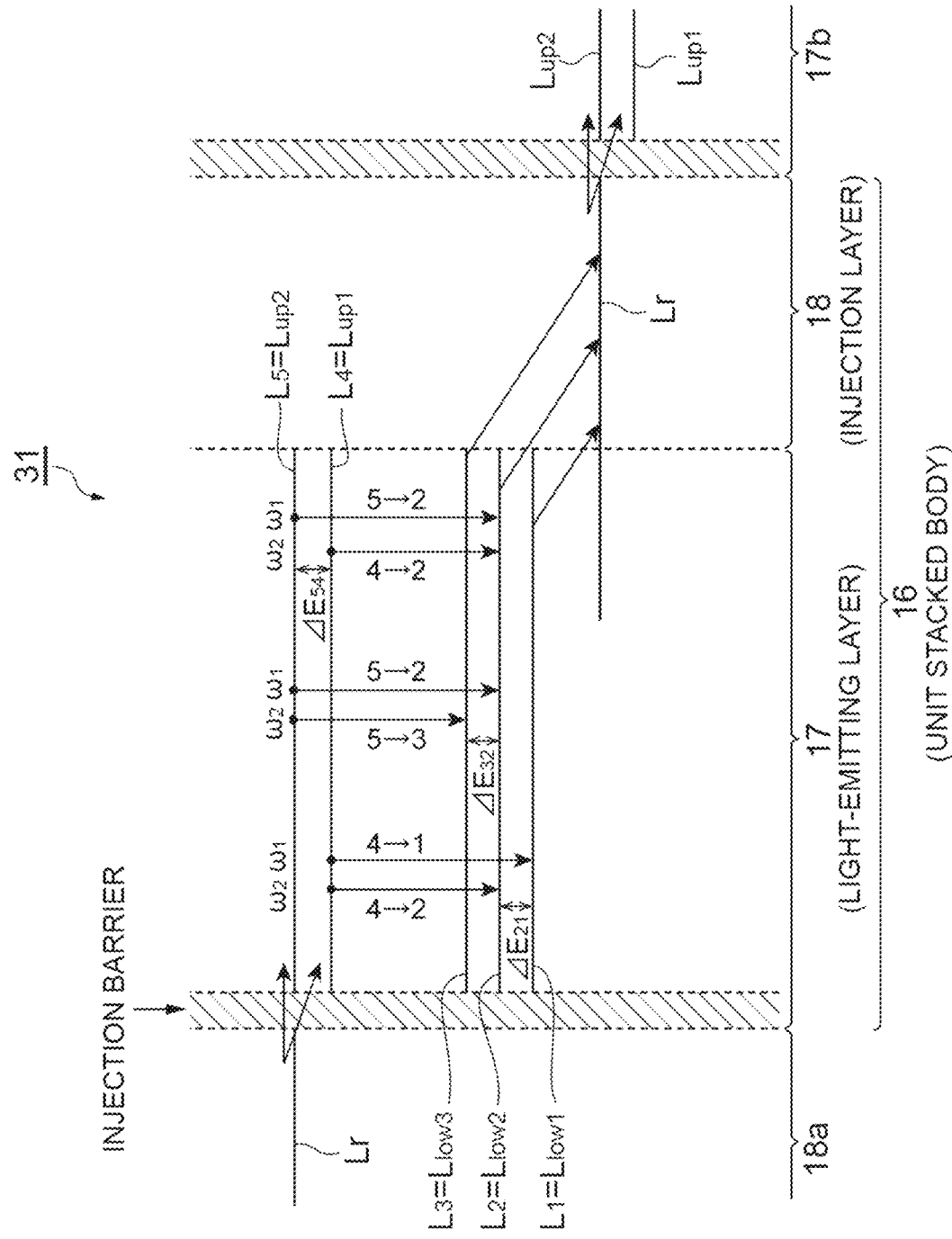
FIG. 5 is a view illustrating an example of a configuration of an active layer of the quantum cascade laser.

As illustrated in FIG. 5, each of a plurality of unit stacked bodies 16 included in the active layer 31 is constituted by a quantum well light-emitting layer 17 and an electron injection layer 18. Each of the quantum well light-emitting layer 17 and the electron injection layer 18 has a predetermined quantum well structure including a quantum well layer and a quantum barrier layer. According to this, in the unit stacked body 16, a subband level structure that is an energy level structure due to the quantum well structure is formed.

In the subband structure, the unit stacked body 16 has a first light emission upper level (Level 4) $L_{up1}=L_4$, and a second light emission upper level (Level 5) $L_{up2}=L_5$ having energy higher than energy of the first light emission upper level. Further, in the subband level structure, the unit stacked body 16 has a first light emission lower level (Level 1) $L_{low1}=L_1$ having energy lower than the first light emission upper level, a second light emission lower level (Level 2) $L_{low2}=L_2$ having energy lower than the first light emission upper level and higher than the first light emission lower level, a third light emission lower level (Level 3) $L_{low3}=L_3$ having energy lower than the first light emission upper level and higher than the second light emission lower level, and relaxation level $L_r$ having energy lower than the light emission lower levels.

An injection barrier layer against electrons injected from an electron injection layer 18a to the quantum well light-emitting layer 17 is provided between the quantum well light-emitting layer 17 and the electron injection layer 18a of a front-stage unit stacked body. A barrier layer that is thin to a certain extent in which a wave function sufficiently seeps is provided between the quantum well light-emitting layer 17 and the electron injection layer 18. Note that, an exit barrier layer against electron exiting from the quantum well light-emitting layer 17 to the electron injection layer 18 may be provided between the quantum well light-emitting layer 17 and the electron injection layer 18 as necessary.

A gap configuration of respective levels in the subband level structure of the unit stacked body 16 is as follows. Specifically, energy $\Delta E_{41}$ of light emission transition (4→1) from the first light emission upper level $L_{up1}$ to the first light emission lower level $L_{low1}$, and energy $\Delta E_{52}$ of light emission transition (5→2) from the second light emission upper level $L_{up2}$ to the second light emission lower level $L_{low2}$ are approximately equal to energy $E_1$ of the pump light of the first frequency $\omega_1$ ($\Delta E_{41}=\Delta E_{52}=E_1$). In addition, energy $\Delta E_{42}$ of light emission transition (4→2) from the first light emission upper level $L_{up1}$ to the second light emission lower level $L_{low2}$ and energy $\Delta E_{53}$ of light emission transition (5→3) from the second light emission upper level $L_{up2}$ to the third light emission lower level $L_{low3}$ are approximately equal to energy $E_2$ of the pump light of the second frequency $\omega_2$ ($\Delta_{E42}=\Delta_{E53}=E_2$). In addition, an energy difference $\Delta E_{21}$ between the first light emission lower level $L_{low1}$ and the second light emission lower level $L_{low2}$, an energy difference $\Delta E_{32}$ between the second light emission lower level $L_{low2}$ and the third light emission lower level $L_{low3}$, and an energy difference $\Delta E_{54}$ between the first light emission upper level $L_{up1}$ and the second light emission upper level $L_{up2}$ are approximately equal to energy $E$ ($=E_1-E_2$) of the terahertz wave of the differential frequency $\omega$ between the first frequency $\omega_1$ and the second frequency $\omega_2$ ($\Delta E_{21}=\Delta E_{32}=\Delta E_{54}=E$). In this embodiment, the first frequency $\omega_1$ is greater than the second frequency $\omega_2$, and the differential frequency is $\omega$ ($=\omega_1-\omega_2$).

In the above-described subband level structure, electrons are injected into the quantum well light-emitting layer 17 from the relaxation level $L_r$ of the front-stage electron injection layer 18a through the injection barrier. According to this, the second light emission upper level $L_{up2}$ coupled to the relaxation level $L_r$ is strongly excited. At this time, sufficient electrons are also supplied to the first light emission upper level $L_{up1}$ through a high-speed scattering process such as electron-electron scattering, and sufficient carriers are supplied to the first light emission upper level $L_{up1}$ and the second light emission upper level $L_{up2}$.

Electrons injected into the first light emission upper level $L_{up1}$ and the second light emission upper level $L_{up2}$ transition to the first light emission lower level $L_{low1}$, the second light emission lower level $L_{low2}$, and the third light emission lower level $L_{low3}$. At this time, light of energy corresponding to an energy difference between subband levels of the light emission upper level and the light emission lower level is generated and is emitted. Particularly, the first pump light of the first frequency $\omega_1$ having the energy $E_1$ and the second pump light of the second frequency $\omega_2$ having the energy $E_2$ are generated and emitted.

Electrons which transition to the first light emission lower level $L_{low1}$, the second light emission lower level $L_{low2}$, and the third light emission lower level $L_{low3}$ are relaxed to the relaxation level $L_r$. In this manner, electrons are extracted from the first light emission lower level $L_{low1}$, the second light emission lower level $L_{low2}$, and the third light emission lower level $L_{low3}$, and thus a reverse distribution for realizing laser oscillation is formed between the first light emission upper level $L_{up1}$ and the second light emission upper level $L_{up2}$, and the first light emission lower level $L_{low1}$, the second light emission lower level $L_{low2}$, and the third light emission lower level $L_{low3}$. Electrons relaxed to the relaxation level $L_r$ are injected into the first light emission upper level $L_{up1}$ and the second light emission upper level $L_{up2}$ of a rear-stage quantum well light-emitting layer 17b in a cascade manner through the electron injection layer 18. Note that, the relaxation level $L_r$ is not limited to a level composed of only one level, and may be a level composed of a plurality of levels, or a level composed of a mini-band.

When the injection of electrons, the light emission transition of electrons, and relaxation of electrons as described above are repeated in the plurality of unit stacked bodies 16 constituting the active layer 31, generation of light occurs in a cascade manner in the active layer 31. When electrons move through the plurality of unit stacked bodies 16 in a cascade manner, the first pump light of the first frequency $\omega_1$ and the second pump light of the second frequency $\omega_2$ are generated by inter-subband light emission transition of electrons in each of the unit stacked bodies 16. Then, a terahertz wave of the differential frequency $\omega(=|\omega_1-\omega_2|)$ between the first frequency $\omega_1$ and the second frequency $\omega_2$ is generated due to differential frequency generation by Cherenkov phase matching.

Figure 6:
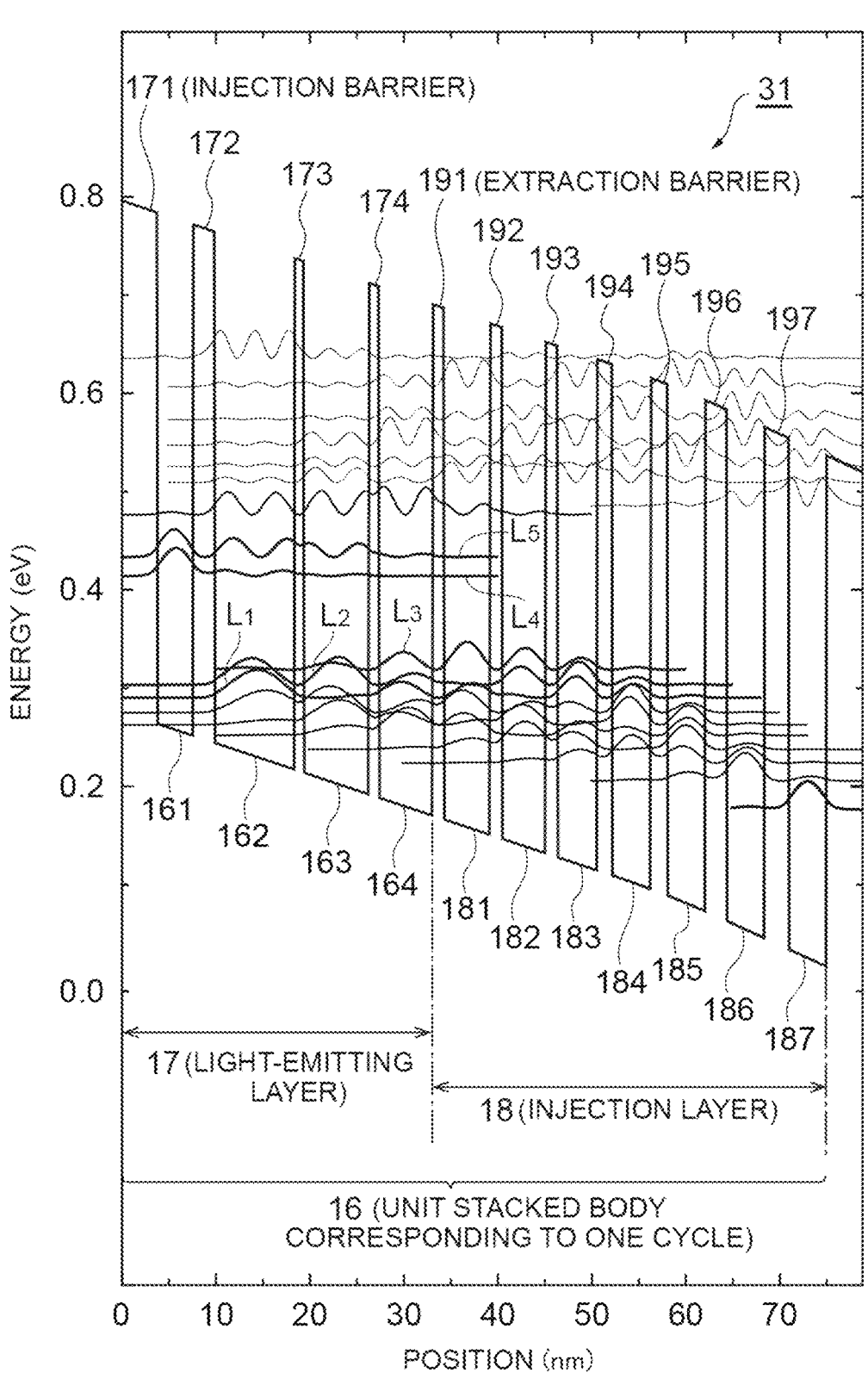
FIG. 6 is a view illustrating a specific example of the configuration of the active layer.

A specific example of the configuration of the active layer 31 will be further described. A subband level structure illustrated in FIG. 6 and FIG. 7 is a specific example of the subband level structure illustrated in FIG. 5. Note that, in FIG. 6, with regard to a part of a repetitive structure by the quantum well light-emitting layer 17 and the electron injection layer 18, a quantum well structure and a subband level structure in an operation electric field are illustrated.

In this specific example, the unit stacked bodies 16 corresponding to 40 cycles are stacked to constitute the active layer 31, and a center wavelength of a gain in the active layer 31 is set to 10 μm. In addition, as illustrated in FIG. 6 and FIG. 7, the unit stacked body 16 corresponding to one cycle is configured in a quantum well structure by alternately stacking eleven quantum well layers 161 to 164 and 181 to 187, and eleven quantum barrier layers 171 to 174 and 191 to 197. Each of the quantum well layers 161 to 164 and 181 to 187 is, for example, an InGaAs layer, and each of the quantum barrier layers 171 to 174 and 191 to 197 is, for example, an InAlAs layer.

In the unit stacked bodies 16, a portion in which four quantum well layers 161 to 164 and four quantum barrier layers 171 to 174 are alternately stacked functions mainly as the quantum well light-emitting layer 17, and a portion in which seven quantum well layers 181 to 187 and seven quantum barrier layers 191 to 197 are alternately stacked functions mainly as the electron injection layer 18. In addition, the quantum barrier layer 171 in a first stage in the quantum well light-emitting layer 17 functions as the injection barrier layer. Note that, in this specific example, an extraction barrier layer that effectively functions as an extraction barrier is not provided between the quantum well light-emitting layer 17 and the electron injection layer 18. In this specific example, the quantum barrier layer 191 is formally defined as the extraction barrier layer, and the quantum well light-emitting layer 17 and the electron injection layer 18 are functionally distinguished before and after the quantum barrier layer 191.

In the active layer 31, in order to realize generation of the terahertz wave by differential frequency generation, it is necessary that pump light components of two wavelengths can be generated, and a high quadratic nonlinear susceptibility $\chi^{(2)}$ is to be maintained with respect to the pump light component of two wavelengths. In this specific example, since a wide gain band of coupling dual-upper-level structure is used by employing the above-described DAU/MS structure, and two kinds of diffraction lattice layers 32*a* and 32*b* are provided in the upper guide layer 32, generation of the first pump light of the first frequency $\omega_1$ and the second pump light of the second frequency $\omega_2$, and generation of the terahertz wave of the differential frequency $\omega$ are realized in a single active layer design.

As illustrated in FIG. 6, the subband level structure of this specific example is designed so that electrons optically transition from strongly coupled first light emission upper level $L_4$ and second light emission level $L_5$ to the first light emission lower level $L_1$, the second light emission lower level $L_2$, and the third light emission lower level $L_3$.

In this specific example, as an energy gap between the first light emission upper level $L_4$ and the second light emission level $L_5$, $\Delta E_{54}$ is 18 meV. As other inter-level energy gaps, $\Delta E_{53}$ is 121 meV, $\Delta E_{52}$ is 136 meV, $\Delta E_{51}$ is 149 meV, $\Delta E_{43}$ is 102 meV, $\Delta E_{42}$ is 117 meV, and $\Delta E_{41}$ is 131 meV.

In this specific example, electrons injected into the quantum well light-emitting layer 17 from a front-stage electron injection layer are distributed similarly to the first light emission upper level $L_4$ and the second light emission level $L_5$ due to high-speed electron-electron scattering or the like, and the first light emission upper level $L_4$ and the second light emission level $L_5$ act like a widen single upper level. Accordingly, a gain due to transition of electrons from the first light emission upper level $L_4$ to the first light emission lower level $L_1$, the second light emission lower level $L_2$, and the third light emission lower level $L_3$, and a gain due to transition of electrons from the second light emission level $L_5$ to the first light emission lower level $L_1$, the second light emission lower level $L_2$, and the third light emission lower level $L_3$ overlap each other in the same contribution, and a wide band light-emission spectrum in a single peak is obtained.

As described above, in the configuration using a single active layer structure, uniform nonlinear optical characteristics are obtained over the entire region of the active layer 31 unlike a configuration using a structure in which a plurality of active layers are stacked, and high-efficiency wave conversion is realized. When assuming that carrier concentrations of the first light emission lower level $L_1$, the second light emission lower level $L_2$, the third light emission lower level $L_3$, the first light emission upper level $L_4$, and the second light emission level $L_5$ are $n_1$ to $n_5$, respectively, and a relationship of $n_1=n_2=n_3$ is established, and when using conditions of $n_5-n_1=1.0\times10^{15}/cm^3$, and $n_4-n_1=1.3\times10^{15}/cm^3$ (i=1, 2, and 3), as an absolute value of a total sum of quadratic nonlinear susceptibility $\chi^{(2)}$ generated by the DAU structure, $|\chi^{(2)}|=23.3$ nm/V is obtained.

A design frequency $\omega_{THz}$, the first frequency $\omega_1$, and the second frequency $\omega_2$ are determined by a DFB structure. A terahertz wave that is finally obtained is determined by $\omega_{THz}=\omega_1-\omega_2$. Generally, in THz NL-QCL (details thereof will be described later), since light emission is obtained in a frequency range of 0.6 to 6 THz, the design frequency $\omega_{THz}$ is designed to be within the range. In this specific example, the design frequency $\omega_{THz}$ is approximately 3 THz. At this time, it is possible to cause the first frequency $\omega_1$ and the second frequency $\omega_2$ to operate in a single mode in combination, and it is possible to cause the terahertz wave to operate in a single mode by using a DFB structure of two cycles.

Next, description will be given of a radiation angle (Cherenkov radiation angle) $\theta_C$ of the terahertz wave with reference to a case where the first pump light and the second pump light are mid-infrared light, a frequency range of the terahertz wave is 1 to 6 THz, and the semiconductor substrate 2 is an InP single crystal substrate. As indicated by an arrow A1 in FIG. 3, the terahertz wave generated by differential frequency generation propagates through the inside of the semiconductor substrate 2 as a plane wave (that is, at the same phase) at a radiation angle $\theta_C$ (angle with respect to a resonance direction A0) expressed by the following Expression (1). In the following Expression (1), $n_{MIR}$ represents a refractive index of an InP single crystal substrate (the semiconductor substrate 2) with respect to the mid-infrared light (the first pump light and the second pump light), and $n_{THz}$ represents a refractive index of the InP single crystal substrate (the semiconductor substrate 2) with respect to the terahertz wave. In addition, the terahertz wave that has propagated through the inside of the semiconductor substrate 2 is incident to the rear surface 2b of the semiconductor substrate 2 at an incident angle $\theta_I$ expressed by the following Expression (2).

$$\theta_C = \cos^{-1}(n_{MIR}/n_{THz}) \tag{1}$$

$$\theta_I = 90° - \theta_C \tag{2}$$

[Method of Manufacturing Active Layer]

Next, a method of manufacturing the active layer 31 will be described. The above-described active layer structure is formed by using a semi-insulating InP substrate (the semiconductor substrate 2) in consideration of absorption of the terahertz wave, and by sequentially and epitaxially growing an InGaAs well layer and an InAlAs barrier layer which are lattice-matched to InP with a molecular beam epitaxy (MBE), metal-organic chemical vapor deposition (MOCVD), or the like. Specifically, first, high-concentration Si-doped InGaAs (Si: $1.5 \times 10^{18}$ cm$^{-3}$) is made to grow to 400 nm as the lower contact layer 37, Si-doped InP (Si: $1.5 \times 10^{16}$ cm$^{-3}$) is made to grow to 5 μm as the lower clad layer 35, and Si-doped InGaAs (Si: $1.5 \times 10^{16}$ cm$^{-3}$) is made to grow to 250 nm as the lower guide layer 33. Next, the active layer 31 is stacked, for example, in 40 cycles, Si-doped InGaAs (Si: $1.5 \times 10^{16}$ cm$^{-3}$) is provided on the active layer 31 up to 450 nm as the upper guide layer 32 that also functions as the DFB diffraction lattice layer, and a diffraction lattice having a depth of, for example, 250 nm is formed with etching. After forming the diffraction lattice, a ridge strip having a width of, for example, 12 μm is formed in a direction orthogonal to the cycle structure of the diffraction lattice. Then, supplementary re-growth of an Fe-doped InP layer (the support layer 38) is performed on both side walls with metal-organic chemical vapor deposition or the like. Next, Si-doped InP (Si: $1.5 \times 10^{16}$ cm$^{-3}$) is made to grow to 5 μm as the upper clad layer 34, and high-concentration Si doping is made to grow as the upper contact layer 36. Next, an InGaAs contact layer (the lower contact layer 37) on the semiconductor substrate 2 side is exposed by etching, and SiN or the like is formed as an insulating film. Next, a contact hole is opened in conformity to the upper and lower InGaAs contact layers (the upper contact layer 36 and the lower contact layer 37), and an Au thick film (thickness: approximately 5 μm) is formed by an evaporation and plating method as an electrode (not illustrated). Finally, upper and lower electrodes are separated by Au etching to complete an element.

[Configuration of QCL and Lens]

Figure 8:
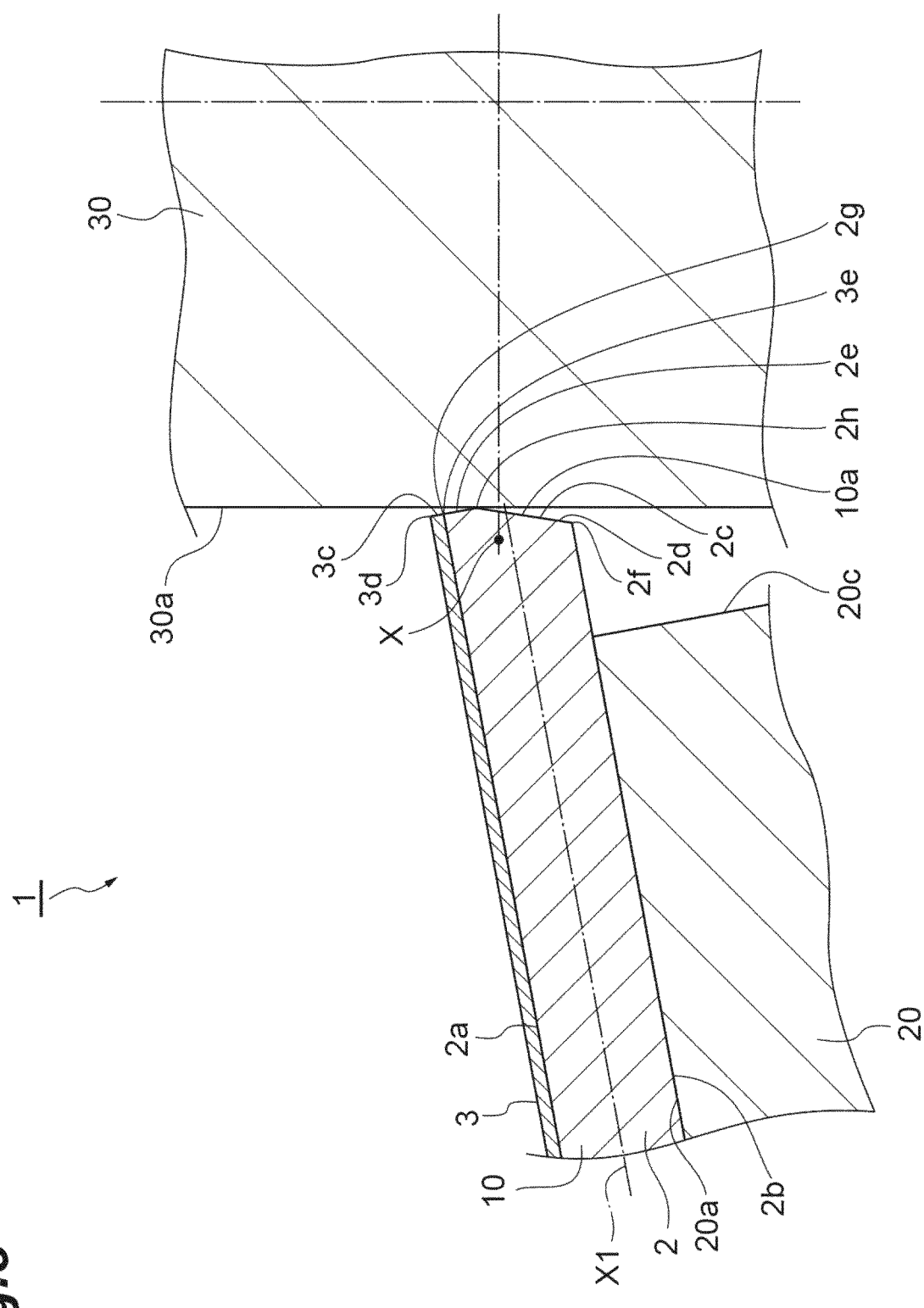
FIG. 8 is an enlarged view of FIG. 2.

Next, configurations of the QCL 10 and the lens 30 will be described in more detail. As illustrated in FIG. 8, the submount 20 is spaced apart from the lens plane 30a. The mounting surface 20a of the submount 20 is inclined with respect to the lens plane 30a. The mounting surface 20a is inclined toward a side opposite to the QCL 10 as being spaced apart from the lens plane 30a. The QCL 10 mounted on the mounting surface 20a is inclined with respect to the lens plane 30a. Specifically, the axial line X1 of the QCL 10 is inclined with respect to the lens plane 30a. That is, the main surface 2a and the rear surface 2b of the semiconductor substrate 2 are inclined with respect to the lens plane 30a. The QCL 10 is inclined toward the submount 20 side as being spaced apart from the lens plane 30a.

The QCL 10 is in contact with the lens plane 30a. Specifically, the first end surface 10a of the QCL 10 further protrudes toward the lens 30 side in comparison to an end surface 20c of the submount 20. According to this, the end surface 20c of the submount 20 is configured not to be in contact with the lens plane 30a. In this embodiment, the semiconductor substrate 2 is in direct contact with the lens plane 30a. Specifically, the semiconductor substrate 2 is in line contact with the lens plane 30a. More specifically, the third corner portion 2h of the semiconductor substrate 2 is in line contact with the lens plane 30a.

The first surface 2d and the second surface 2e of the semiconductor substrate 2, and the side surface 3c of the semiconductor layer 3 are inclined with respect to the lens plane 30a. Specifically, the first surface 2d is inclined to be further spaced apart from the lens plane 30a as going from the third corner portion 2h toward the first corner portion 2f. The second surface 2e is inclined to be further spaced apart from the lens plane 30a as going from the third corner portion 2h toward the second corner portion 2g. The side surface 3c is inclined to be further spaced apart from the lens plane 30a as going from the second edge 3e toward the first edge 3d. Note that, the end surface 31a of the active layer 31 (refer to FIG. 3) which constitutes the side surface 3c is also inclined with respect to the lens plane 30a as in the side surface 3c. The end surface 31a is not in contact with the lens plane 30a. That is, the entirety of the end surface 31a is spaced apart from the lens plane 30a.

A focal point X of the lens 30 is located inside the QCL 10. In other words, the QCL 10 is disposed so that the focal point X of the lens 30 is located inside the QCL 10. In this embodiment, the focal point X of the lens 30 is located inside the semiconductor substrate 2.

[Operation and Effect]

As described above, in the laser module 1, the semiconductor substrate 2 is in direct contact with the lens plane 30a. According to this, it is possible to cause the terahertz wave to propagate to the lens plane 30a through the semiconductor substrate 2, and thus extraction efficiency of the terahertz wave can be improved. Further, the end surface 31a of the active layer 31 is inclined with respect to the lens plane 30a. That is, the entirety of the end surface 31a of the active layer 31 is not in contact with the lens plane 30a. According to this, in the end surface 31a of the active layer 31 that constitutes a resonator, it is possible to cause light for generating the terahertz wave to be stably oscillate. As described above, according to the laser module 1, light oscillation in the active layer 31 is stabilized, and the extraction efficiency of the terahertz wave generated in the active layer 31 can be improved. In addition, the semiconductor substrate 2 has strong mechanical strength in comparison to the semiconductor layer 3, and is less likely to be broken. Accordingly, when the semiconductor substrate 2 is brought into contact with the lens plane 30a as described above, breakage of the QCL 10 is further suppressed in comparison to a case where the semiconductor layer 3 (for example, a portion on the upper clad layer 34 side in comparison to the active layer 31) is brought into contact with the lens plane 30a.

As described above, in this embodiment, the terahertz wave generated in the QCL 10 is coupled to the lens 30, and thus highly efficient extraction of the terahertz wave is realized. For example, the QCL 10 and the lens 30 are disposed so that the lens 30 is located at a site where the lens 30 is in contact with the third corner portion 2h of the semiconductor substrate 2 of the QCL 10 and the intensity of the terahertz wave inside the QCL 10 becomes strong. According to this, the terahertz wave propagates to the inside of the lens 30 without through a free space, and is condensed and output to the outside. In addition, in the case of using a silicon lens as the lens 30, a divergence angle is greatly reduced, and a terahertz beam shape can be greatly improved.

An effect of the above-described laser module 1 will be supplemented. When a lens plane is brought into contact with a laser end surface of a terahertz quantum cascade laser (THz-QCL), a reflectance of the end surface varies, and oscillation of pump light may be hindered. On the other hand, as in the laser module 1 of this embodiment, in the case of a technology (THz NL-QCL) that generates a terahertz wave by a differential frequency generation using a nonlinear optical effect (nonlinear mixing: NL) inside mid-infrared QCL, the terahertz wave is not generated by direct oscillation, and is generated by the differential frequency generation by mid-infrared pump light. Accordingly, the factor as in the above-described direct oscillation THz-QCL (factor that may hinder generation of the pump light) does not exist. However, according to finding of the present inventors, in the THz NL-QCL, since strong oscillation is caused to occur in the mid-infrared pump light, in the case of strongly pressing the vicinity of a waveguide structure of a mid-infrared laser end surface (that is, the end surface 31a) of the THz NL-QCL against the lens plane 30a, there is a possibility that a reflectance of the important end surface 31a with respect to the mid-infrared oscillation may be affected. Therefore, it is preferable that a region in the vicinity of the mid-infrared laser waveguide and the lens are not brought into contact with each other. Accordingly, according to the laser module 1 in which the end surface 31a of the active layer 31 is spaced apart from the lens plane 30a as described above, light oscillation in the active layer 31 can be stabilized. On the other hand, it is known that the THz NL-QCL can generate the terahertz wave under a room temperature environment. However, the amount of the terahertz wave absorbed by the substrate is relatively large, and thus it is required to improve extraction efficiency of the terahertz wave. In this regard, in the laser module 1, as described above, a portion (the side surface 2c of the semiconductor substrate 2 in this embodiment) other than the end surface 31a that constitutes a resonator is brought into contact with the lens plane 30a, and thus extraction efficiency of the terahertz wave can be improved while stabilizing light oscillation. As described above, according to the laser module 1, a small-sized terahertz light source that can operate at a room temperature and has high general-purpose properties can be realized.

In addition, the focal point X of the lens 30 is located inside the QCL 10. According to this configuration, it is possible to cause the terahertz wave to more efficiently propagate to the lens 30 side.

Figure 9:
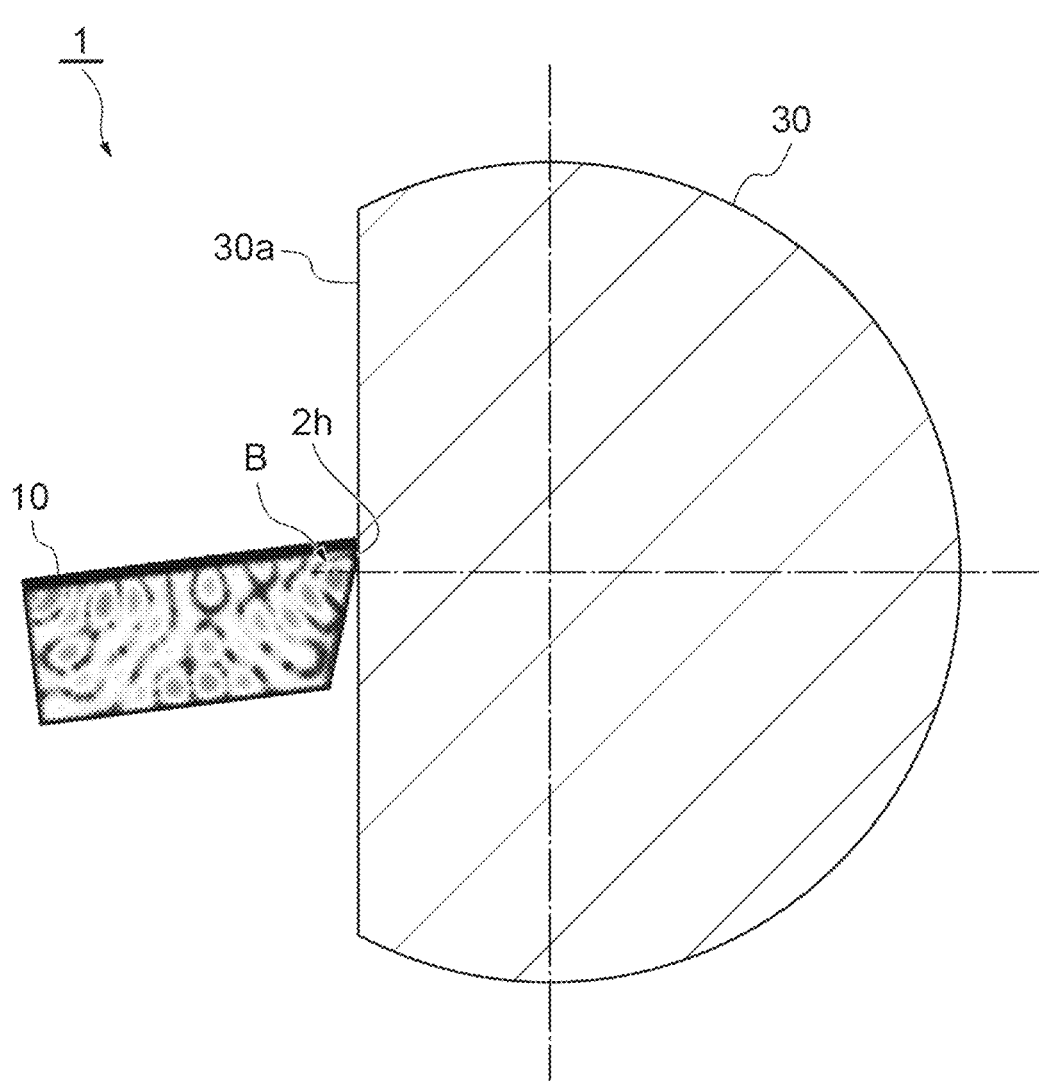
FIG. 9 is a view illustrating an intensity distribution of a terahertz wave at the inside of the quantum cascade laser.

In addition, the semiconductor substrate 2 is in line contact with the lens plane 30a. According to this configuration, a contact area of the semiconductor substrate 2 with respect to the lens plane 30a is reduced as small as possible, and thus it is possible to cause the terahertz wave to more efficiently propagate to the lens side. That is, the terahertz wave generated in the active layer 31 propagates through the inside of the QCL 10, and repeats reflection at an interface between the QCL 10 and the air (hereinafter, referred to as an interface). As a result, an electric field distribution is formed inside the QCL 10 in a normal state. Specifically, as illustrated in FIG. 9, at a corner portion (for example, the vicinity (portion indicated by an arrow B) of the third corner portion 2h) in an end portion of the QCL 10 in the vicinity of a crystal growth layer, a component of a terahertz wave propagating from the active layer 31 toward the interface of the QCL 10 and a component of a terahertz wave reflected at the interface enter a state of reinforcing each other. When the portion where the terahertz wave components reinforce each other is brought into line contact with the lens 30, the terahertz wave can be allowed to propagate to the inside of the lens 30 through a contact portion between the QCL 10 and the lens 30. Here, the lens 30 may be a super hemispherical lens formed by high-resistance silicon having resistivity of 100 $\Omega$·cm or greater. In this case, the amount of the terahertz wave absorbed inside the lens 30 is extremely small, and thus the terahertz wave introduced into the lens 30 is not attenuated, and can be condensed. In this embodiment, the lens 30 is a silicon super hemispherical lens in which resistivity is 1 k$\Omega$·cm, a diameter is 6 mm, and the center thickness is 3.7 mm.

In addition, the semiconductor substrate 2 has the first surface 2d that extends from the rear surface 2b to the main surface 2a side to be inclined with respect to the lens plane 30a. The third corner portion 2h formed at the end portion of the first surface 2d on the main surface 2a side is in line contact with the lens plane 30a. According to this configuration, the third corner portion 2h formed at the end portion of the first surface 2d on the main surface 2a side is brought into contact with the lens plane 30a, thereby realizing a configuration of bringing the semiconductor substrate 2 and the lens plane 30a into line contact with each other.

Next, the effect of the laser module 1 will be described with reference to an example and a comparative example.

Comparative Example

Figure 10:
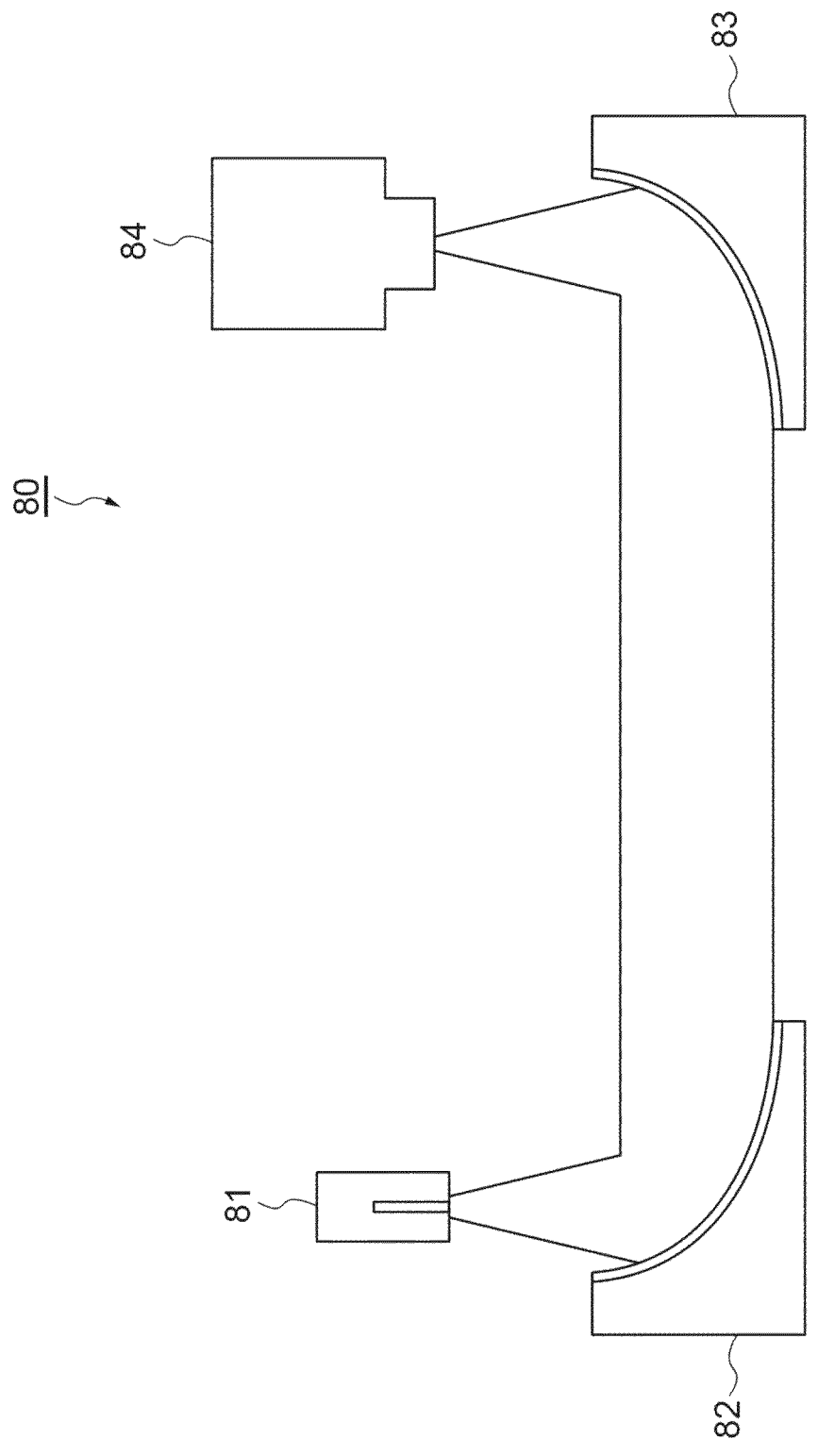
FIG. 10 is a view illustrating a measurement device according to a comparative example.

FIG. 10 is a view illustrating a measurement device 80 according to a comparative example. As illustrated in FIG. 10, the measurement device 80 includes a QCL 81, parabolic mirrors 82 and 83, and a detection unit 84. The QCL 81 is different from the QCL 10 in that the first surface 2d (polished surface) is not formed. The parabolic mirrors 82 and 83 are off-axis parabolic mirrors (OAP), and collect an output of a terahertz wave. The terahertz wave output from the QCL 81 is converted into parallel light with the parabolic mirror 82, and is incident to the detection unit 84 through the parabolic mirror 83. The detection unit 84 detects intensity of the incident terahertz wave or the like. Note that, collection efficiency of each of the parabolic mirrors 82 and 83 is approximately 60%.

Example

Figure 11:
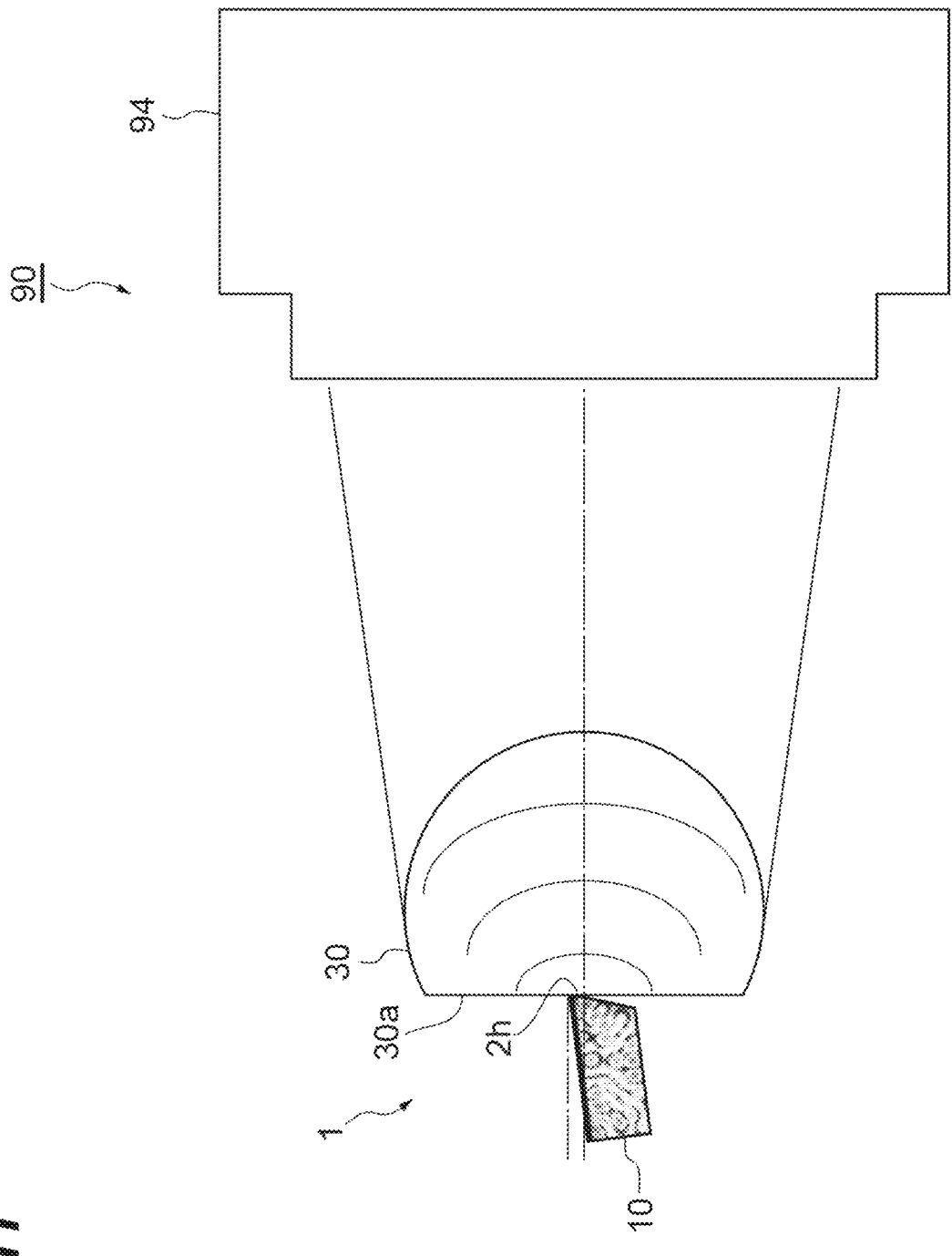
FIG. 11 is a view illustrating a measurement device according to an example.

FIG. 11 is a view illustrating a measurement device 90 according to an example. The measurement device 90 includes a laser module 1 and a detection unit 94. The detection unit 94 is provided at a position facing an emitting plane (spherical plane opposite to the lens plane 30a) of the lens 30. A terahertz wave output from the QCL 10 is condensed with the lens 30 and is incident to the detection unit 94. The detection unit 94 detects intensity of the incident terahertz wave or the like.

Figure 12:
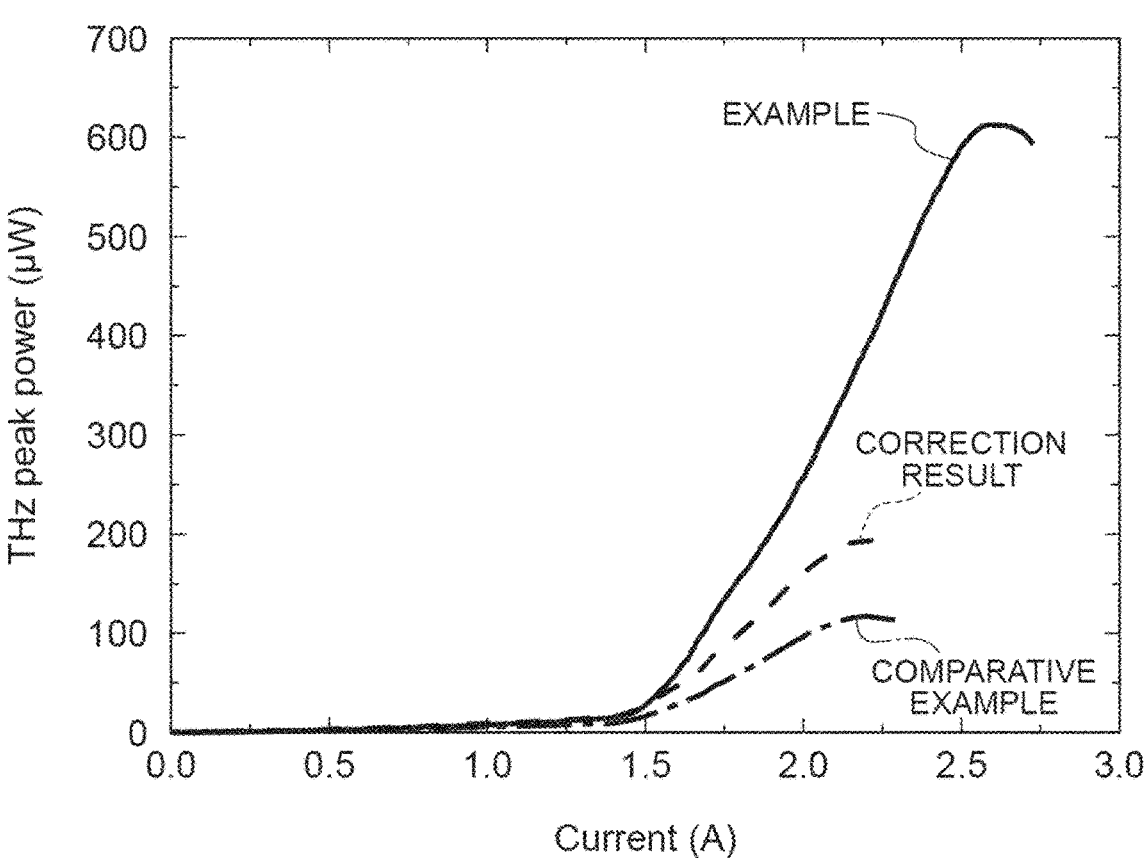
FIG. 12 is a graph showing measurement results of the comparative example and the example.

FIG. 12 is a graph showing measurement results of the comparative example and the example. FIG. 12 shows comparison of current-output characteristics between the comparative example and the example. Measurement was performed by using a Golay cell of a THz detector (detection units 84 and 94) under a room temperature and atmosphere environment. The QCLs 81 and 10 were driven at 100 kHz and 200 ns, and a signal thereof was detected by a lock-in amplifier. As shown in FIG. 12, in the comparative example, it was confirmed that a peak output of the terahertz wave is approximately 120 μW. On the other hand, in the example, it was confirmed that the peak output of the terahertz wave is approximately 630 μW. As described above, in the example, terahertz wave intensity approximately five times terahertz wave intensity of the comparative example was detected. Note that, a dotted line in FIG. 12 represents a correction result of the measurement result of the comparative example with collection efficiency of the parabolic mirrors 82 and 83. Specifically, the correction result is intensity of the terahertz wave in the case of assuming that the collection efficiency of the parabolic mirrors 82 and 83 is 100%. As described above, the output of the terahertz wave in the case of the example was greatly larger than the output of the terahertz wave of the comparative example even when correcting the collection efficiency of the parabolic mirrors 82 and 83 of the comparative example.

Modification Example

Hereinbefore, an embodiment of the present disclosure has been described, but the present disclosure is not limited to the above-described embodiment.

First Modification Example

Figure 13:
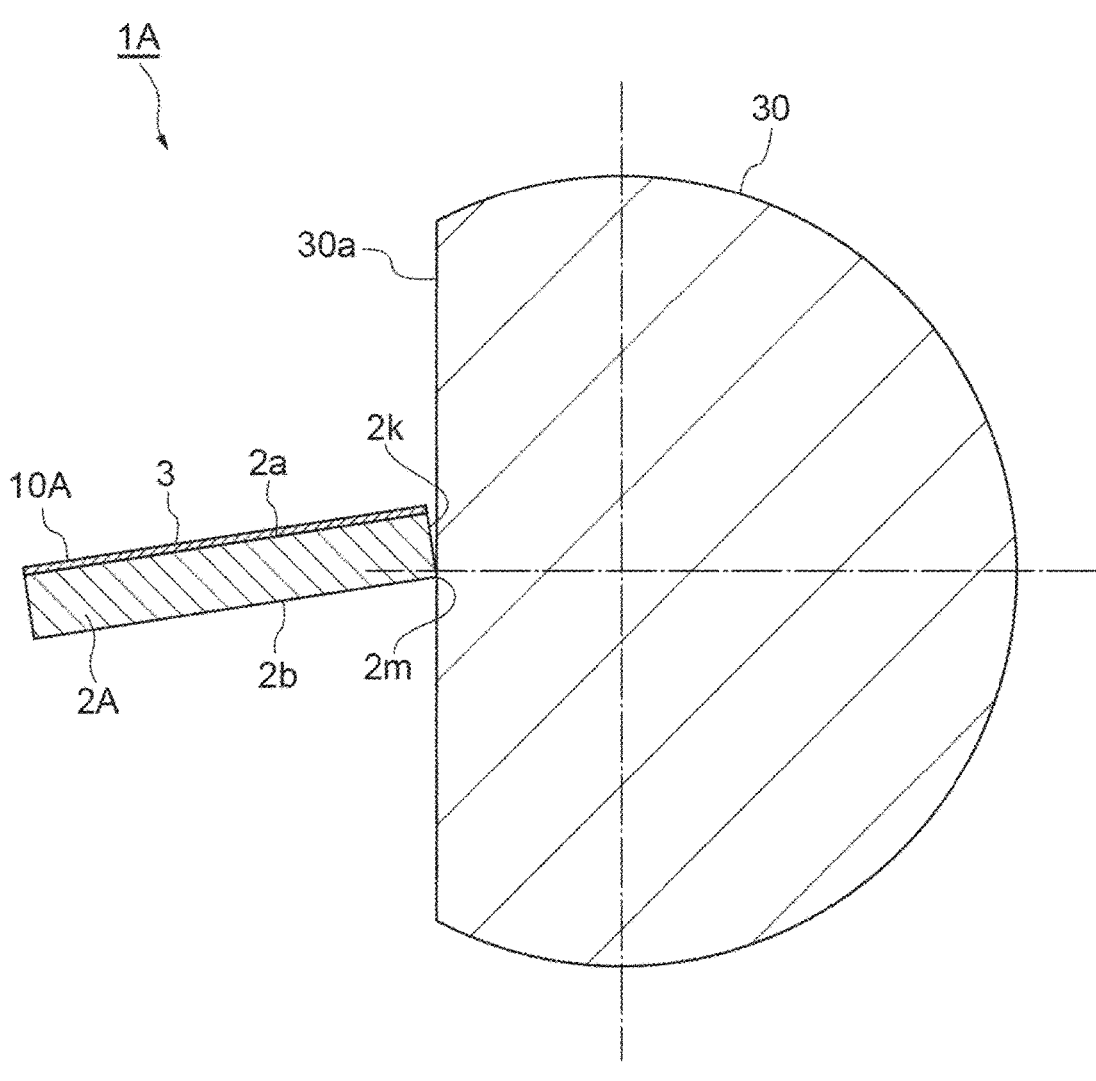
FIG. 13 is a view illustrating a modification example of the laser module.

FIG. 13 is a view illustrating a first modification example of the laser module. As illustrated in FIG. 13, a laser module 1A according to a first modification example is different from the laser module 1 in that a QCL 10A is provided instead of the QCL 10. The QCL 10A is different from the QCL 10 in that a semiconductor substrate 2A is provided instead of the semiconductor substrate 2. The semiconductor substrate 2A is formed in a rectangular plate shape, and is different from the semiconductor substrate 2 in that the first surface 2d and the second surface 2e are not provided. That is, a side surface 2k of the semiconductor substrate 2A is a flat surface that is approximately orthogonal to the main surface 2a and the rear surface 2b unlike the side surface 2c of the semiconductor substrate 2.

In the laser module 1A, a corner portion 2m formed between the side surface 2k and the rear surface 2b is in line contact with the lens plane 30a. According to this configuration, the corner portion 2m is brought into contact with the lens plane 30a, thereby realizing a configuration of bringing the semiconductor substrate 2A and the lens plane 30a into line contact with each other. Accordingly, it is not necessary to form the first surface 2d by polishing or the like as in the semiconductor substrate 2, and thus a process of manufacturing the QCL 10A can be simplified.

In the laser module 1A, the thickness of the semiconductor substrate 2A from the main surface 2a to the rear surface 2b may be 200 μm or less. According to this configuration, attenuation of the terahertz wave generated in the active layer 31 at the inside of the semiconductor substrate 2A is suppressed, and extraction efficiency of the terahertz wave can be further improved. That is, in the case of polishing the semiconductor substrate 2A to be sufficiently thin, the terahertz wave reaches the rear surface 2b before being completely attenuated inside the semiconductor substrate 2A. For example, in a case where a frequency of the terahertz wave is approximately 3 THz, and the thickness of the semiconductor substrate 2A is approximately 300 μm, the terahertz wave is attenuated up to approximately 1/e at the inside of the semiconductor substrate 2A. According to this, when the semiconductor substrate 2A is made to be thin up to 200 μm or less and the semiconductor substrate 2A is brought into contact with the lens 30, extraction efficiency of the terahertz wave can be improved as in the laser module 1.

Second Modification Example

Figure 14:
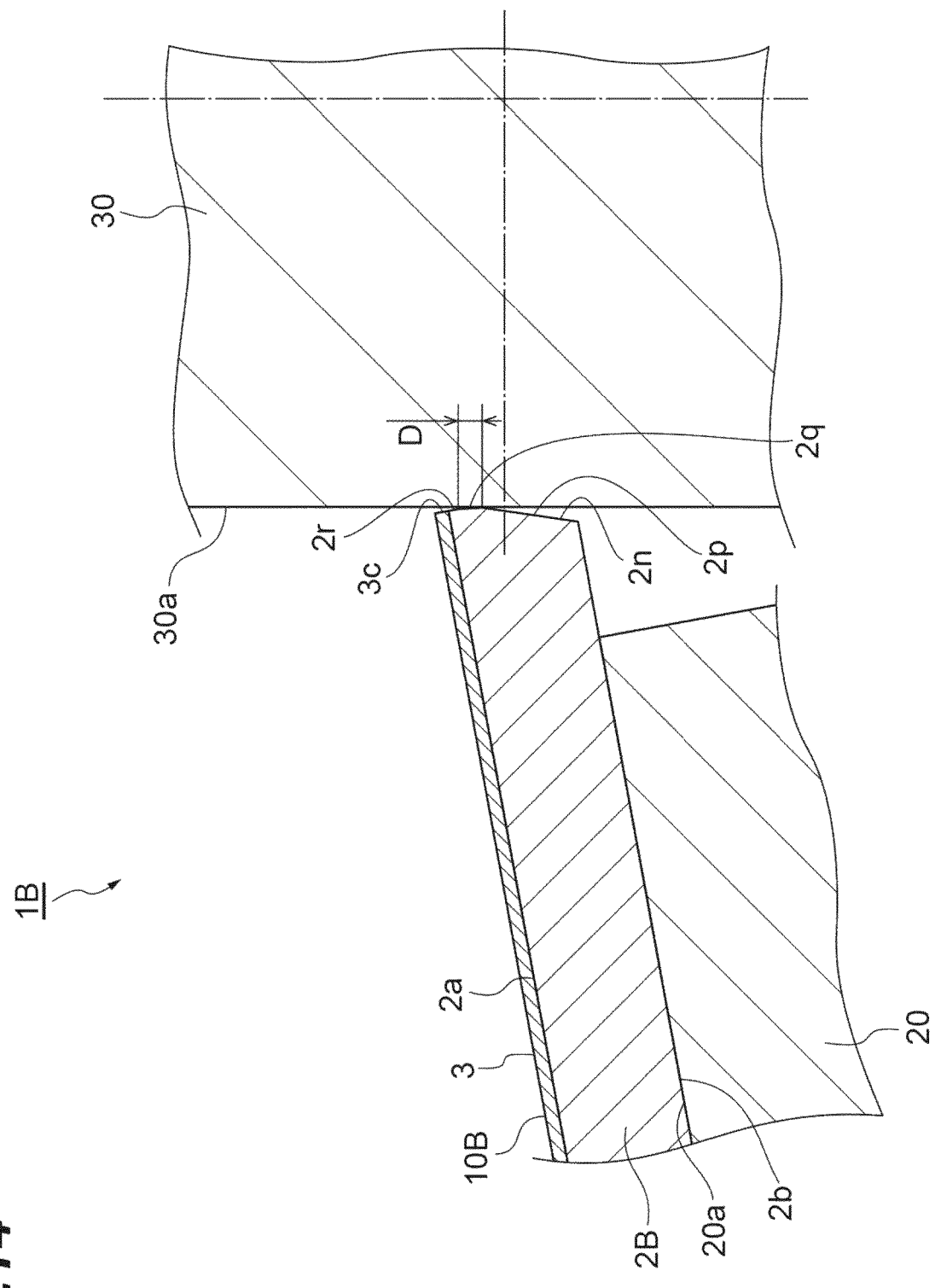
FIG. 14 is a view illustrating a modification example of the laser module.

FIG. 14 is a view illustrating a second modification example of the laser module. As illustrated in FIG. 14, a laser module 1B according to the second modification example is different from the laser module 1 in that a QCL 10B is provided instead of the QCL 10. The QCL 10B is different from the QCL 10 in that a semiconductor substrate 2B is provided instead of the semiconductor substrate 2. The semiconductor substrate 2B is different from the semiconductor substrate 2 in that a side surface 2n is provided instead of the side surface 2c, and the semiconductor substrate 2B is in surface contact with the lens plane 30a.

Specifically, the side surface 2n includes a first surface 2p, a second surface 2q, and a third surface 2r. The first surface 2p is a flat surface. The first surface 2p is connected to the rear surface 2b, and extends from the rear surface 2b to the main surface 2a side. The first surface 2p is inclined with respect to the main surface 2a and the rear surface 2b. The first surface 2p is inclined to be further spaced apart from a second end surface of the QCL 10B (end surface on a side opposite to an end surface of the QCL 10B which faces the lens plane 30a) as going from the rear surface 2b toward the main surface 2a side. For example, the first surface 2p is formed by polishing a rectangular plate-shaped semiconductor substrate. That is, the first surface 2p is a polished surface.

The second surface 2q is a flat surface. The second surface 2q is connected to an end portion of the first surface 2p on the main surface 2a side, and extends from the first surface 2p to the main surface 2a side. The second surface 2q is inclined with respect to the main surface 2a, the rear surface 2b, and the first surface 2p. The second surface 2q is inclined to be further spaced apart from the second end surface of the QCL 10B as going toward from the rear surface 2b toward the main surface 2a side. As in the first surface 2p, the second surface 2q is formed by polishing the semiconductor substrate. That is, the second surface 2q is a polished surface. The second surface 2q is a surface parallel to the lens plane 30a. The second surface 2q is in surface contact with the lens plane 30a. Note that, a width (length in a crystal growth direction) D of the second surface 2q is preferably 100 μm or less.

The third surface 2r is a flat surface. The third surface 2r is connected to an end portion of the second surface 2q on the main surface 2a side and the main surface 2a. The third surface 2r is inclined with respect to the first surface 2p and the second surface 2q. The third surface 2r is approximately orthogonal to the main surface 2a and the rear surface 2b. The third surface 2r is flush with the side surface 3c of the semiconductor layer 3.

According to this configuration, since a contact area of the semiconductor substrate 2B with respect to the lens plane 30a further increases in comparison to a case where the lens plane 30a and the semiconductor substrate are brought into line contact, breakage of the semiconductor substrate 2B at a contact portion between the lens plane 30a and the semiconductor substrate 2B is suppressed. In addition, the second surface 2q parallel to the lens plane 30a is brought into contact with the lens plane 30a, thereby realizing a configuration of bringing the semiconductor substrate 2B and the lens plane 30a into surface contact with each other. In addition, since the first surface 2p is provided, a contact area (that is, an area of the second surface $2q$) between the semiconductor substrate 2B and the lens plane $30a$ can be suppressed to be small.

Third Modification Example

Figure 15:
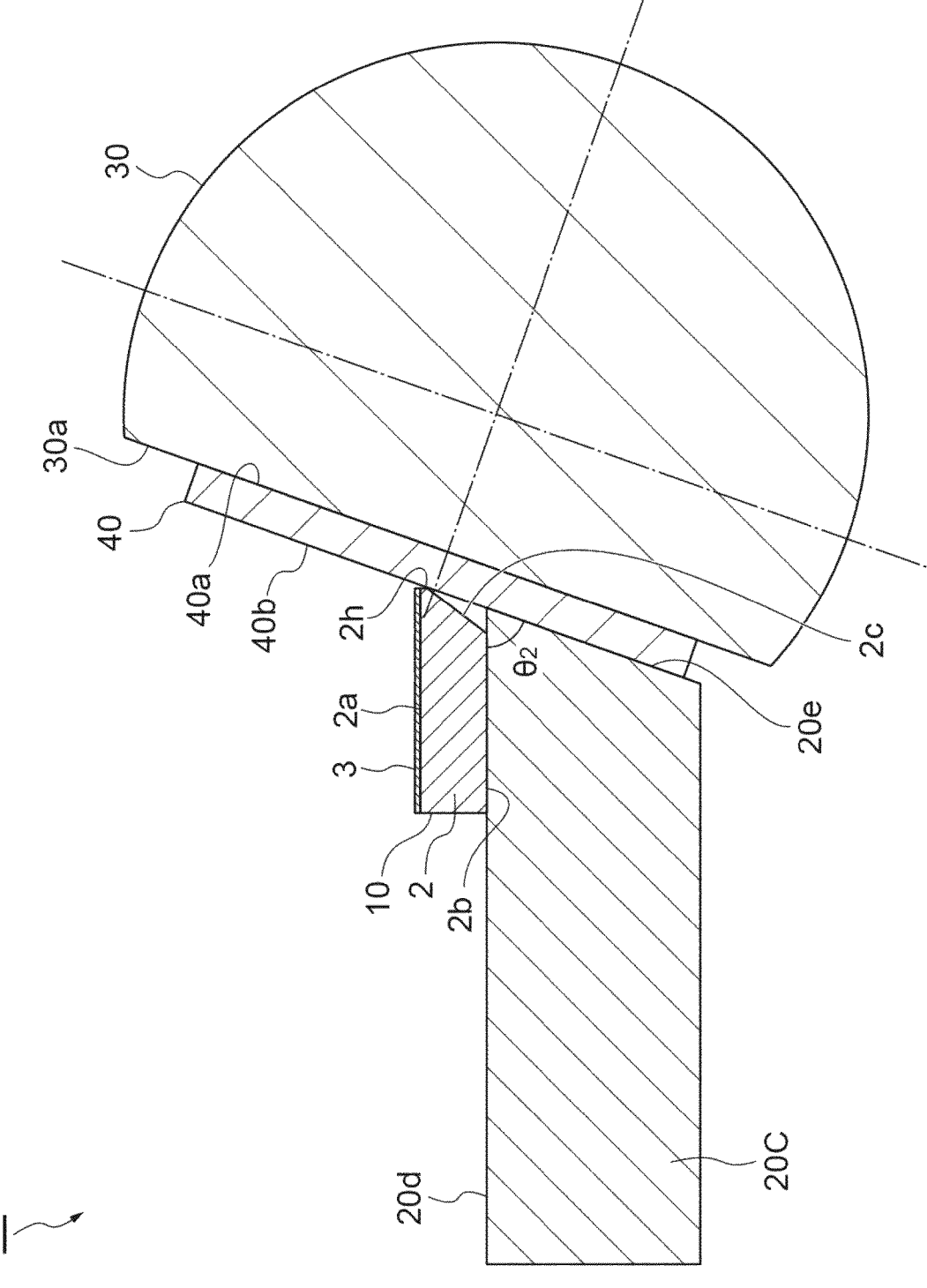
FIG. 15 is a view illustrating a modification example of the laser module.

FIG. 15 is a view illustrating a third modification example of the laser module. As illustrated in FIG. 15, a laser module 1C according to the third modification example is different from the laser module 1 in that a spacer 40 is further provided. In addition, the laser module 1C includes a submount 20C instead of the submount 20.

Specifically, the spacer 40 is disposed between the QCL 10 and the submount 20C, and the lens 30. The spacer 40 has a plate shape. The spacer 40 has an output surface $40a$ and an input surface $40b$ opposite to the output surface $40a$. The output surface $40a$ is parallel to the lens plane $30a$ and is in contact with the lens plane $30a$. The semiconductor substrate 2 is in indirect contact with the lens plane $30a$. Specifically, the semiconductor substrate 2 is in direct contact with the input surface $40b$. More specifically, the semiconductor substrate 2 is in line contact with the input surface $40b$. The third corner portion $2h$ of the semiconductor substrate 2 is in line contact with the input surface $40b$.

Figure 16:
FIG. 16 is an enlarged view of FIG. 15.

The side surface $2c$ of the semiconductor substrate 2 and the side surface $3c$ of the semiconductor layer 3 are inclined with respect to the input surface $40b$. Specifically, as illustrated in FIG. 16, the first surface $2d$ is inclined to be further spaced apart from the input surface $40b$ as going from the third corner portion $2h$ toward the first corner portion $2f$. The second surface $2e$ is inclined to be further spaced apart from the input surface $40b$ as going from the third corner portion $2h$ toward the second corner portion $2g$. The side surface $3c$ is inclined to be further spaced apart from the input surface $40b$ as going from the second edge $3e$ toward the first edge $3d$. Note that, the end surface $31a$ of the active layer 31 which constitutes the side surface $3c$ (refer to FIG. 3) is also inclined with respect to the input surface $40b$ as in the side surface $3c$. The end surface $31a$ is not in contact with the input surface $40b$. That is, the entirety of the end surface $31a$ is spaced apart from the input surface $40b$.

For example, when moving the lens 30 with respect to the QCL 10 in a state where the semiconductor substrate 2 is brought into contact with the lens plane $30a$ for alignment (optical axis alignment) of the lens 30 with respect to the QCL 10, there is a concern that the QCL 10 may be broken due to friction between the QCL 10 and the lens plane $30a$. According to this configuration, in a state where a positional relationship between the QCL 10 and the spacer 40 is fixed (that is, a state where friction does not occur between the QCL 10 and the spacer 40), when moving the lens 30 with respect to the spacer 40, alignment of the lens 30 with respect to the QCL 10 can be performed. According to this, breakage of the QCL 10 is suppressed.

A refractive index of the spacer 40 of the laser module 1C is approximately the same as a refractive index of the lens 30. According to this configuration, attenuation of the terahertz wave at an interface between the spacer 40 and the lens 30 can be suppressed.

As illustrated in FIG. 15, the submount 20C has a mounting surface $20d$ and a contact surface $20e$. The rear surface $2b$ of the semiconductor substrate 2 is mounted on the mounting surface $20d$. The contact surface $20e$ is connected to the mounting surface $20d$. The contact surface $20e$ is inclined with respect to the mounting surface $20d$. An angle $\theta_2$ made by the mounting surface $20d$ and the contact surface $20e$ is an acute angle. The contact surface $20e$ faces the input surface $40b$ of the spacer 40. The contact surface $20e$ is a surface parallel to the input surface $40b$. The contact surface $20e$ is in contact with the input surface $40b$. According to this configuration, positioning of the QCL 10 and the spacer 40 can be easily performed through the submount 20C. That is, when rear surface $2b$ of the semiconductor substrate 2 is mounted on the mounting surface $20d$ and the input surface $40b$ of the spacer 40 is made to follow the contact surface $20e$, arrangement of the QCL 10, the spacer 40, and the lens 30 is easily performed, and positioning of the QCL 10 with respect to the lens 30 can be easily performed.

Other Modification Examples

In the above-described embodiment, as the lens plane of the lens 30, the flat lens plane $30a$ in which the entirety is located on the same plane has been exemplified, but the entirety of the lens plane may not necessarily be located on the same plane. For example, the lens plane of the lens 30 may include a first portion facing the end surface $31a$ of the active layer 31, and a second portion that is connected to the first portion and is inclined with respect to the first portion. In this case, the end surface $31a$ of the active layer 31 may be inclined with respect to at least a portion (that is, the first portion) facing the end surface $31a$ in the lens plane of the lens 30, and may be parallel to a portion (for example, the second portion) that does not face the end surface $31a$ in the lens plane. Even in this case, a configuration in which the end surface $31a$ is not in contact with the lens plane of the lens 30 can be realized, and the same effect as in the above-described embodiment is exhibited.

In addition, in the laser module 1, the side surface $2c$ of the semiconductor substrate 2 may not include the second surface $2e$. Specifically, the side surface $2c$ may include only the first surface $2d$. That is, the first surface $2d$ may be provided in a region ranging from the rear surface $2b$ of the semiconductor substrate 2 to the main surface $2a$. In this case, the third corner portion $2h$ that is in contact with the lens plane $30a$ is formed between the first surface $2d$ and the main surface $2a$. Similarly, in the laser module 1B, the semiconductor substrate 2B may not have the third surface $2r$. Specifically, the side surface $2n$ of the semiconductor substrate 2B may have only the first surface $2p$ and the second surface $2q$. In this case, the second surface $2q$ is connected to the first surface $2p$ and the main surface $2a$.

In addition, in the above-described embodiment, description has been given of an example in which the lens 30 is a super hemispherical lens formed from high-resistance silicon, but the lens 30 may be formed from a material having a refractive index higher than a refractive index of the air. For example, the material of the lens 30 may be zinc selenide (ZnSe), germanium (Ge), magnesium oxide (MgO), or the like. In addition, the lens 30 may not necessarily be the super hemispherical lens. For example, instead of the lens 30 of the above-described embodiment, a meta-lens that has a flat surface using a sub-wavelength structure (surface provided with a convex-concave structure in a sub-wavelength level) or the like may be used as the lens plane.

In addition, the QCL 10, 10A, or 10B is pressed against the lens plane $30a$, and thus not only the semiconductor substrate 2, 2A, or 2B but also layers (the lower guide layer 33, the lower clad layer 35, and the lower contact layer 37) in the semiconductor layer 3 on a further semiconductor substrate side in comparison to the active layer 31 may be in direct contact or indirect contact with the lens plane $30a$.

In addition, the laser module 1C may not include the spacer 40. In this case, the contact surface $20e$ of the submount 20C may be in contact with the lens plane 30a. According to this, positioning of the QCL 10 can be easily performed. That is, when the rear surface 2b of the semiconductor substrate 2 is mounted on the mounting surface 20d and the lens plane 30a of the lens 30 is made to follow the contact surface 20e, arrangement of the QCL 10 and the lens 30 is easily performed, and positioning of the QCL 10 with respect to the lens 30 can be easily performed.

In addition, one kind of diffraction lattice layer may be provided in the semiconductor layer 3 instead of two kinds of diffraction lattice layers 32a and 32b, or three or more kinds of diffraction lattice layers may be provided in the semiconductor layer 3. The diffraction lattice layer that functions as a distribution feedback structure may cause at least one of the first pump light and the second pump light to oscillate in a single mode. In addition, instead of the diffraction lattice layer that functions as the distribution feedback structure, a configuration using differential frequency generation in a configuration in which an oscillation spectrum width in a Fabry-Perot operation is widened to 1 THz or greater may be employed. In this configuration, an output of terahertz light is lower in comparison to the diffraction lattice layer that functions as the distribution feedback structure, but a wideband THz spectrum can be obtained.

In addition, the active layer 31 is not limited to a configuration using one kind of coupling dual-upper-level structure, and may use two or more kinds of active layer structures. In addition, the active layer 31 may use, for example, a bound-to-continuum structure, a two phonon resonance structure, or the like without limitation to the configuration using the coupling dual-upper-level structure.

In addition, the semiconductor substrates 2, 2A, and 2B are not limited to a semi-insulating InP single crystal substrate, and may be, for example, an undoped InP single crystal substrate (Si doped: to $5\times10^{15}$/cm$^3$), a low-doped InP single crystal substrate (Si doped: $5\times10^{15}$/cm$^3$ to $1\times10^{17}$/cm$^3$), or the like. However, from the viewpoint of reducing absorption loss of output light in the semiconductor substrates 2, 2A, and 2B, the semiconductor substrates 2, 2A, and 2B are preferably a semi-insulating substrate that is not doped with impurities. In addition, the semiconductor substrates 2, 2A, and 2B may be a substrate other than the InP substrate, and may be, for example, a silicon single crystal substrate.

In addition, in the above-described specific example, the active layer 31 having a configuration of being lattice-matched to the InP single crystal substrate has been exemplified, but the active layer 31 may be an active layer using a configuration in which strain compensation is introduced. In addition, with regard to a semiconductor material system of the active layer 31, for example, various semiconductor material systems such as GaAs/AlGaAs, InAs/AlSb, GaN/AlGaN, and SiGe/Si can be applied without limitation to the above-described InGaAs/InAlAs. In addition, also with regard to a semiconductor crystal growth method, various methods may be applied.

Next, an effect verification result of the laser module 1 will be described. FIG. 17 is a view illustrating an electromagnetic field simulation result illustrating propagation of the terahertz wave from the QCL 10 to the lens 30 or the air. An upper stage of FIG. 17 illustrates simulation conditions, and a lower stage illustrates a result corresponding to each condition. FIG. 17(a) illustrates a case where the third corner portion 2h and the lens plane 30a are in line contact with each other, and the angle θ made by the first surface 2d and the lens plane 30a is 5°. FIG. 17(b) illustrates a case where the third corner portion 2h and the lens plane 30a are in line contact with each other, and the angle θ made by the first surface 2d and the lens plane 30a is 10°. FIG. 17(c) illustrates a case where the third corner portion 2h and the lens plane 30a are in line contact with each other, and the angle θ made by the first surface 2d and the lens plane 30a is 15°. FIG. 17(d) illustrates a case where the QCL 10 and the lens 30 are not in contact with each other. Note that, also in any conditions illustrated in FIG. 17(a) to FIG. 17(c), a portion other than a portion that is in contact with the lens 30 in the QCL 10 is in contact with only the air. In the condition illustrated in FIG. 17(d), the QCL 10 is in contact with only the air. Each of FIG. 18(a) to FIG. 18(c) is a view illustrating a beam pattern (an output distribution of the terahertz wave propagated from the QCL 10) in the lens plane 30a in each case of FIG. 17(a) to FIG. 17(c), and FIG. 18(d) is a view illustrating a beam pattern in an air layer in the case of FIG. 17(d).

As illustrated in FIG. 17(a) to FIG. 17(d) and FIG. 18(a) to FIG. 18(d), in a case where the QCL 10 is in contact with the lens 30, at least in a portion (portion indicated by an arrow C) that is in contact with the QCL 10 in the lens 30, a propagation amount of the terahertz wave from the QCL 10 to the lens 30 is larger in comparison to a case where the QCL 10 is not in contact with the lens 30. In addition, since the terahertz wave generated in the active layer 31 (refer to FIG. 3) is attenuated inside the semiconductor substrate 2 (refer to FIG. 3), the QCL 10 is preferably in contact with the lens 30 at a position close to the active layer 31. For example, the shortest distance from the position that is in contact with the lens 30 in the semiconductor substrate 2 to the active layer 31 is within 150 μm, preferably within 100 μm, and more preferably within 50 μm.

Figure 19:
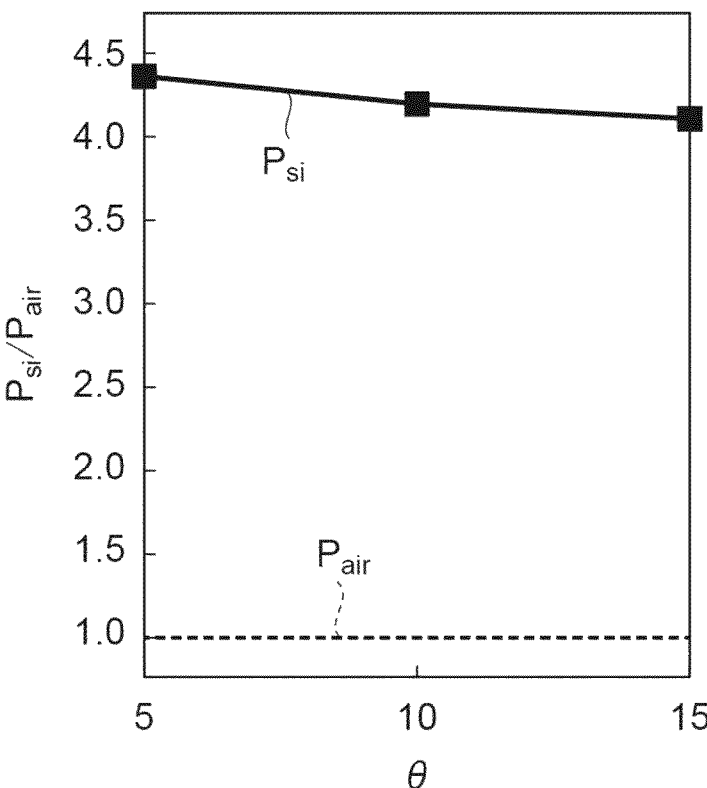
FIG. 19 is a view illustrating an effect verification result of the laser module.

FIG. 19 is a view illustrating total power Psi in a case where the QCL 10 is in contact with the lens 30 (each case of FIG. 18(a) to FIG. 18(c)) for every angle θ when total power (an integrated value of an output of the terahertz wave) Pair of the terahertz wave when the QCL 10 is not in contact with the lens 30 (case of FIG. 18(d)) is set to 1. As illustrated in FIG. 19, when the QCL 10 is brought into contact with the lens 30, power approximately four times or more power in a case where the terahertz wave is extracted from the QCL 10 to the air layer could be obtained regardless of the angle θ made by the first surface 2d and the lens plane 30a. From the above-described simulation results, the effect and importance of a configuration of bringing the QCL 10 into contact with the lens 30 was shown.

REFERENCE SIGNS LIST 1, 1A, 1B, 1C: laser module, 2, 2A, 2B: semiconductor substrate, 2a: main surface, 2b: rear surface, 2c, 2k, 2n: side surface, 2d, 2p: first surface, 2e, 2q: second surface, 2r: third surface, 10, 10A, 10B: quantum cascade laser (QCL), 20, 20C: submount (mounting portion), 20a, 20d: mounting surface, 20e: contact surface, 30: lens, 30a: lens plane, 31: active layer, 31a: end surface, 34: upper clad layer (second clad layer), 35: lower clad layer (first clad layer), 40: spacer, 40a: output surface, 40b: input surface, X: focal point.

The invention claimed is:

1. A laser module comprising:
    a quantum cascade laser that includes:
        a substrate having a main surface, a rear surface opposite to the main surface, and a side surface extending between the main surface and the rear surface, the side surface defining an apex corner portion;
        a first clad layer provided on the main surface;

an active layer provided on a side of the first clad layer which is opposite to the substrate; and a second clad layer provided on a side of the active layer which is opposite to the first clad layer, wherein an end surface of the active layer in a direction intersecting a stacking direction of the substrate, the first clad layer, the active layer, and the second clad layer constitutes a resonator that causes light of a first frequency and light of a second frequency to oscillate, and the active layer is configured to generate a terahertz wave of a differential frequency between the first frequency and the second frequency; and a lens that has a lens plane disposed at a position facing the end surface of the active layer, wherein the substrate is in direct contact or indirect contact with the lens plane, the end surface of the active layer is inclined with respect to a portion facing the end surface in the lens plane, wherein the substrate is in contact with the lens plane only at the apex corner portion of the side surface such that the substrate is in line contact with the lens plane, and the end surface of the active layer is inclined away from the lens plane to form a space between the end surface of the active layer and the lens, and wherein the main surface of the substrate is inclined with respect to the lens plane.

2. The laser module according to claim 1, wherein a focal point of the lens is located inside the quantum cascade laser.

3. The laser module according to claim 1, wherein the thickness of the substrate from the main surface to the rear surface is 200 μm or less.

4. The laser module according to claim 1, further comprising:

a spacer that is disposed between the quantum cascade laser and the lens, wherein the spacer has an output surface that is parallel to the lens plane and is in contact with the lens plane, and an input surface opposite to the output surface, the substrate is in contact with the input surface of the spacer, and the end surface of the active layer is inclined with respect to the input surface of the spacer.

5. The laser module according to claim 4, wherein a refractive index of the spacer is approximately the same as a refractive index of the lens.

6. The laser module according to claim 5, further comprising:

a mounting portion that includes a mounting surface on which the rear surface of the substrate is mounted, and a contact surface that is connected to the mounting surface and is in contact with the input surface of the spacer, wherein an angle made by the mounting surface and the contact surface is an acute angle.

\* \* \* \* \*